(12) United States Patent
Lee

(10) Patent No.: US 10,580,904 B2
(45) Date of Patent: Mar. 3, 2020

(54) THIN FILM TRANSISTOR AND DISPLAY DEVICE INCLUDING THIN FILM TRANSISTOR

(71) Applicant: LG Display Co., Ltd., Seoul (KR)

(72) Inventor: SeungMin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/040,177

(22) Filed: Jul. 19, 2018

(65) Prior Publication Data

US 2019/0043997 A1   Feb. 7, 2019

(30) Foreign Application Priority Data

Aug. 4, 2017 (KR) .................. 10-2017-0099215

(51) Int. Cl.
| | |
|---|---|
| *H01L 29/786* | (2006.01) |
| *H01L 29/417* | (2006.01) |
| *H01L 29/423* | (2006.01) |
| *H01L 27/32* | (2006.01) |

(Continued)

(52) U.S. Cl.
CPC ..... *H01L 29/78648* (2013.01); *G09G 3/3291* (2013.01); *H01L 27/1225* (2013.01); *H01L 27/1251* (2013.01); *H01L 27/3262* (2013.01); *H01L 27/3276* (2013.01); *H01L 29/41733* (2013.01); *H01L 29/42384* (2013.01);

(Continued)

(58) Field of Classification Search
CPC ..... H01L 51/56; H01L 51/0072; H01L 43/02; H01L 51/5056; H01L 43/10

USPC ........................................................... 257/72
See application file for complete search history.

(56) References Cited

U.S. PATENT DOCUMENTS

| | | |
|---|---|---|
| 2005/0269645 A1 | 12/2005 | Kato |
| 2007/0120200 A1 | 5/2007 | Yun |

(Continued)

FOREIGN PATENT DOCUMENTS

| | | |
|---|---|---|
| JP | 6-291269 A | 10/1994 |
| JP | 2005-354023 A | 12/2005 |

(Continued)

OTHER PUBLICATIONS

Park et al., "Prospects of Oxide TFTs approaching LTPS," *AM-FPD*, Kyoto, Japan, Jul. 1-4, 2015, pp. 241-244.

*Primary Examiner* — Andy Huynh
(74) *Attorney, Agent, or Firm* — Seed IP Law Group LLP

(57) ABSTRACT

Disclosed are a thin film transistor and a display device including the thin film transistor. The thin film transistor comprises: a bottom gate electrode on a substrate; a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer; a first source electrode and a first drain electrode respectively connected to the P-type semiconductor layer; a second source electrode and a second drain electrode respectively connected to a portion of the N-type semiconductor layer which is not overlapped with the P-type semiconductor layer; and a top gate electrode above the semiconductor layer. According to the embodiment of the present disclosure, a complexity of a manufacturing process of the thin film transistor is reduced.

23 Claims, 12 Drawing Sheets

(51) Int. Cl.
*G09G 3/3291* (2016.01)
*H01L 27/12* (2006.01)

(52) U.S. Cl.
CPC ..... *H01L 29/7869* (2013.01); *G09G 2310/08* (2013.01); *H01L 29/78696* (2013.01)

(56) References Cited

U.S. PATENT DOCUMENTS

| | | | |
|---|---|---|---|
| 2009/0283763 A1* | 11/2009 | Park | H01L 29/78621 |
| | | | 257/43 |
| 2012/0298982 A1 | 11/2012 | Liu et al. | |
| 2015/0144952 A1 | 5/2015 | Kim et al. | |
| 2015/0171120 A1 | 6/2015 | Kaneko et al. | |
| 2016/0027811 A1 | 1/2016 | Li et al. | |
| 2016/0315104 A1 | 10/2016 | Han et al. | |
| 2017/0148817 A1* | 5/2017 | Shi | H01L 29/78648 |
| 2017/0294497 A1* | 10/2017 | Lius | H01L 27/1255 |

FOREIGN PATENT DOCUMENTS

| | | |
|---|---|---|
| JP | 2013-125826 A | 6/2013 |
| KR | 10-0711000 B1 | 4/2007 |

\* cited by examiner

THIN FILM TRANSISTOR AND DISPLAY DEVICE INCLUDING THIN FILM TRANSISTOR

CROSS-REFERENCE TO RELATED APPLICATIONS

This application claims the benefit of the Korean Patent Application No. 10-2017-0099215 filed on Aug. 4, 2017, which is hereby incorporated by reference as if fully set forth herein.

BACKGROUND

Technical Field

The present disclosure relates to a thin film transistor (TFT) and a display device including the TFT.

Description of the Related Art

With the advancement of information-oriented society, various requirements for display devices for displaying an image are increasing. Recently, various flat panel display devices such as liquid crystal display (LCD) devices, plasma display panel (PDP) devices, and organic light emitting display devices are being practically used.

Flat panel display devices, such as LCD devices and organic light emitting display devices, each include a display panel, a gate driving circuit, a data driving circuit, and a timing controller. The display panel includes a plurality of data lines, a plurality of gate lines, and a plurality of pixels which are respectively provided in a plurality of pixel areas defined by intersections of the data lines and the gate lines and are supplied with data voltages of the data lines when gate signals are supplied to the gate lines. The pixels emit lights having certain brightness with the data voltages.

Moreover, the flat panel display devices drive the pixels and the gate driving circuit by using TFTs as switching elements. The pixels and/or the gate driving circuit of each of the flat panel display devices may include a N-type TFT having a N-type semiconductor characteristic and a P-type TFT having a P-type semiconductor characteristic. The N-type TFT and the P-type TFT may each be a metal oxide semiconductor field effect transistor (MOSFET) which controls a flow of a current with an electric field.

If the flat panel display devices each include a N-type oxide semiconductor transistor and a P-type oxide semiconductor transistor, a manufacturing process is complicated. For example, in a case where a N-type semiconductor layer is formed and then a P-type semiconductor layer is formed, the N-type semiconductor layer can be etched when patterning the P-type semiconductor layer. In order to solve such a problem, a passivation layer for protecting the N-type semiconductor layer is formed, and after the P-type semiconductor layer is patterned, the passivation layer is removed. That is, in a case where the flat panel display devices each include both of the N-type oxide semiconductor transistor and the P-type oxide semiconductor transistor, in addition to a process of forming the N-type semiconductor layer or the P-type semiconductor layer, a process of forming and removing the passivation layer may be additionally performed in comparison with a case where the flat panel display devices each include one of the N-type oxide semiconductor transistor and the P-type oxide semiconductor transistor.

BRIEF SUMMARY

Accordingly, the present disclosure is directed to provide a TFT and a display device including the TFT that substantially obviate one or more problems due to limitations and disadvantages of the related art.

An aspect of the present disclosure is directed to provide a TFT including a N-type semiconductor layer and a P-type semiconductor layer, a method of manufacturing the same, and a display device including the TFT, in which a complexity of a manufacturing process is reduced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a TFT comprising: a bottom gate electrode on a substrate; a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer; a first source electrode and a first drain electrode respectively connected to the P-type semiconductor layer; a second source electrode and a second drain electrode respectively connected to a portion of the N-type semiconductor layer which is not overlapped with the P-type semiconductor layer; and a top gate electrode above the semiconductor layer.

In another aspect of the present disclosure, there is provided a display device including a thin film transistor, wherein the display device comprises: a display panel; a data driving circuit; and a gate driving circuit, wherein the display panel or the gate driving circuit comprises a thin film transistor and the thin film transistor comprising: a bottom gate electrode on a substrate; a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer; a first source electrode and a first drain electrode respectively connected to the P-type semiconductor layer; a second source electrode and a second drain electrode respectively connected to a portion of the N-type semiconductor layer which is not overlapped with the P-type semiconductor layer; and a top gate electrode above the semiconductor layer.

In another aspect of the present disclosure, there is provided a TFT comprising a first bottom gate electrode and a second bottom gate electrode on a substrate; a first semiconductor layer overlapping with the first bottom gate electrode and a second semiconductor layer overlapping with the second bottom gate electrode, wherein the second semiconductor layer comprises a second N-type semiconductor layer and a second P-type semiconductor layer, and the second N-type semiconductor layer is overlapped partly with the second P-type semiconductor layer; a first source electrode and a first drain electrode respectively connected to the first semiconductor layer; a second source electrode and a second drain electrode respectively connected to a portion of the second N-type semiconductor layer which is not overlapped with the second P-type semiconductor layer; and a first top gate electrode on the first semiconductor layer.

In another aspect of the present disclosure, there is provided a display device including a thin film transistor, wherein the display device comprises: a display panel; a data driving circuit; and a gate driving circuit, wherein the display panel or the gate driving circuit comprises a thin film transistor and the thin film transistor comprising: a first bottom gate electrode and a second bottom gate electrode on a substrate; a first semiconductor layer overlapping with the first bottom gate electrode and a second semiconductor layer overlapping with the second bottom gate electrode, wherein the second semiconductor layer comprises a second N-type semiconductor layer and a second P-type semiconductor layer, and the second N-type semiconductor layer is overlapped partly with the second P-type semiconductor layer; a first source electrode and a first drain electrode respectively connected to the first semiconductor layer; a second source electrode and a second drain electrode respectively connected to a portion of the second N-type semiconductor layer which is not overlapped with the second P-type semiconductor layer; and a first top gate electrode on the first semiconductor layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
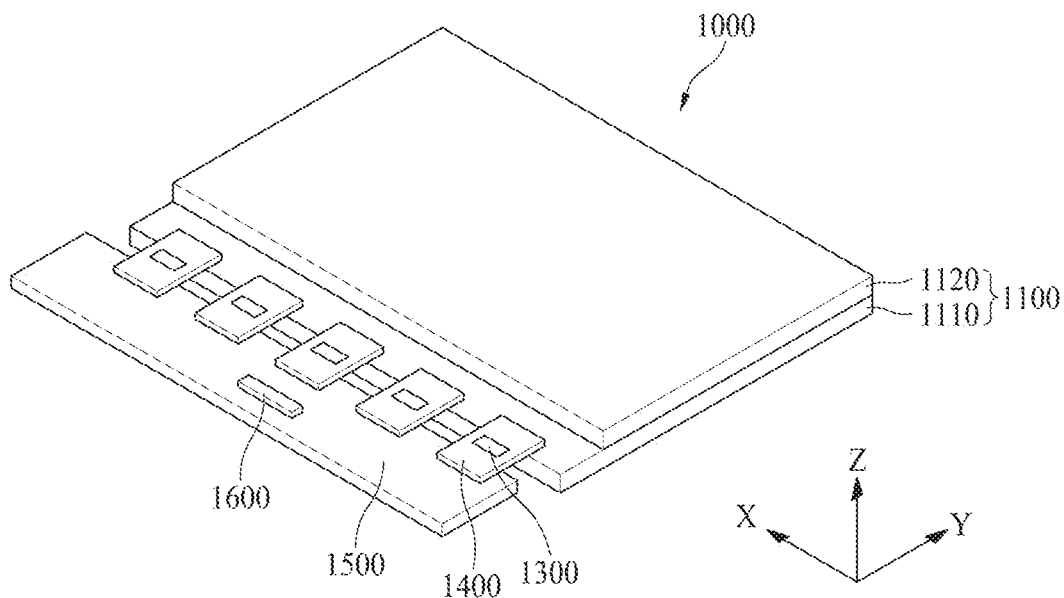
FIG. 1 is a perspective view illustrating a display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~,' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
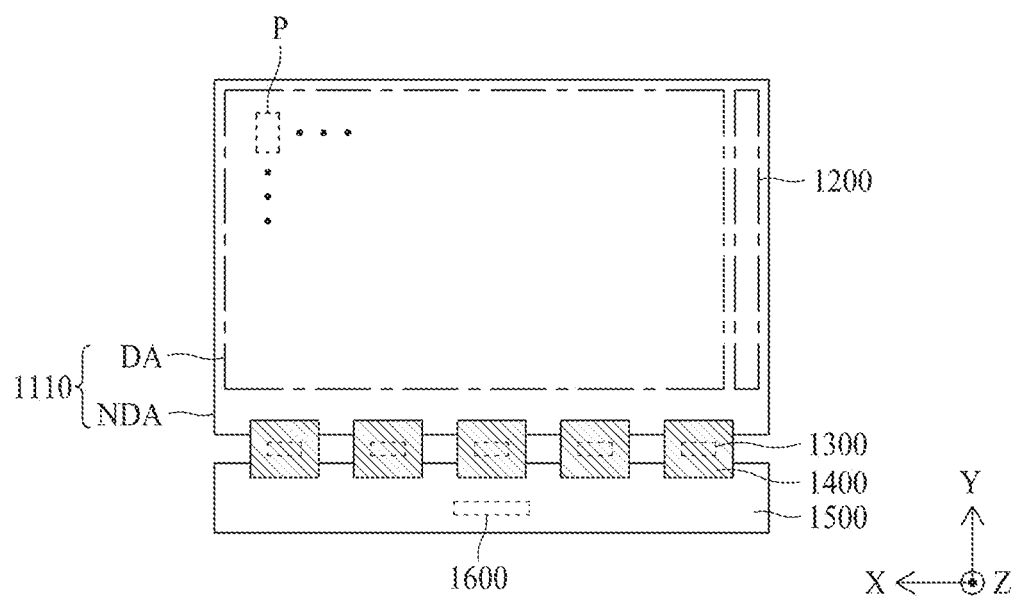
FIG. 2 is a plan view illustrating a first substrate, a gate driver, a source drive integrated circuit (IC), a flexible film, a circuit board, and a timing controller illustrated in FIG. 1.

FIG. 1 is a perspective view illustrating a display device according to an embodiment of the present disclosure. FIG. 2 is a plan view illustrating a first substrate, a gate driver, a source drive integrated circuit (IC), a flexible film, a circuit board, and a timing controller illustrated in FIG. 1.

Referring to FIGS. 1 and 2, an organic light emitting display device 1000 according to an embodiment of the present disclosure may include a display panel 1100, a gate driver (gate driving circuit) 1200, a source drive IC (data driving circuit) 1300, a flexible film 1400, a circuit board 1500, and a timing controller 1600. The display device according to an embodiment of the present disclosure may be implemented with one of an LCD device, an organic light emitting display device, a field emission display device, and an electrophoresis display device.

The display panel 1100 may include a first substrate 1110 and a second substrate 1120. The second substrate 1120 may be an encapsulation substrate. The first substrate 1110 and the second substrate 1120 may each be a plastic film or glass.

A plurality of gate lines, a plurality of data lines, and a plurality of pixels P may be provided on one surface of the first substrate 1110 facing the second substrate 1120. The pixels P may be respectively provided in a plurality of areas defined by an intersection structure of the gate lines and the data lines. Each of the pixels P may include a transistor which is turned on by a gate signal of a corresponding gate line and supplies a data voltage of a corresponding data line to an element of a corresponding pixel P. The transistor may be a thin film transistor (TFT).

The display panel 1100, as in FIG. 2, may be divided into a display area DA where the pixels P are provided to display an image and a non-display area NDA which does not display an image. The gate lines, the data lines, and the pixels P may be provided in the display area DA. The gate driver 1200, a plurality of pads, and a plurality of link lines connecting the data lines to the pads may be provided in the non-display area NDA.

The gate driver 1200 may supply gate signals to the gate lines according to a gate control signal input from the timing controller 1600. The gate driver 1200 may be provided as a gate driver in panel (GIP) type in the non-display area NDA outside one side or both sides of the display area DA of the display panel 1100. The gate driver 1200 may include the transistor(s) in panel (GIP) type.

The source drive IC 1300 may receive digital video data and a source control signal from the timing controller 1600. The source drive IC 1300 may convert the digital video data into analog data voltages according to the source control signal and may supply the analog data voltages to the data lines. In a case where the source drive IC 1300 is implemented as a driving chip, the source drive IC 1300 may be mounted on the flexible film 1400 in a chip on film (COF) type or a chip on plastic (COP) type.

The pads such as data pads may be provided in the non-display area NDA of the display panel 1100. A plurality of lines connecting the pads to the source drive IC 1300 and a plurality of lines connecting the pads to lines of the circuit board 1500 may be provided on the flexible film 1400. The flexible film 1400 may be attached on the pads by using an anisotropic conductive film, and thus, the pads may be connected to the lines of the flexible film 1400.

The flexible film 1400 may be provided in plurality, and the circuit board 1500 may be attached on the flexible films 1400. A plurality of circuits respectively implemented as driving chips may be mounted on the circuit board 1500. For example, the timing controller 1600 may be mounted on the circuit board 1500. The circuit board 1500 may be a printed circuit board (PCB) or a flexible PCB (FPCB).

The timing controller 1600 may receive the digital video data and a timing signal from an external system board through a cable of the circuit board 1500. The timing controller 1600 may generate a gate control signal for controlling an operation timing of the gate driver 1200 and the source control signal for controlling the source drive IC 1300 which is provided in plurality, based on the timing signal. The timing controller 1600 may supply the gate control signal to the gate driver 1200 and may supply the source control signal to the source drive ICs 1300.

The display device may use both of a P-type TFT having a P-type semiconductor characteristic and a N-type TFT having a N-type semiconductor characteristic, for driving.

For example, in a case where the display device is implemented with an organic light emitting display device, each of the pixels P may include a plurality of transistors such as a switching transistor and a driving transistor. In this case, the switching transistor may be provided as the N-type TFT, and the driving transistor may be provided as the P-type TFT. Alternatively, the switching transistor may be provided as the P-type TFT, and the driving transistor may be provided as the N-type TFT.

Moreover, the display device may include a complementary metal oxide semiconductor (CMOS) circuit, for outputting the gate signals. Alternatively, the display device may include the CMOS circuit, for outputting another signal.

Figure 3:
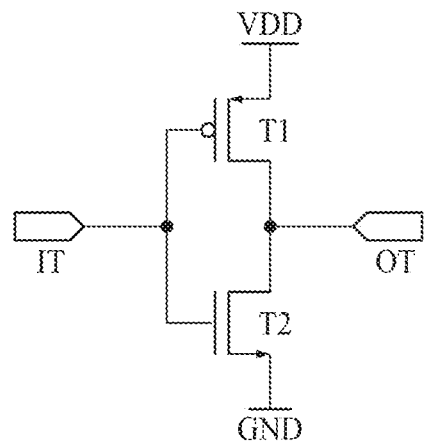
FIG. 3 is a circuit diagram illustrating a complementary metal oxide semiconductor (CMOS) circuit.

The CMOS circuit, as in FIG. 3, may include a first transistor T1 having the P-type semiconductor characteristic and a second transistor T2 having the N-type semiconductor characteristic. A gate electrode of the first transistor T1 and a gate electrode of the second transistor T2 may be connected to an input terminal IT. A source electrode of the first transistor T1 may be connected to a driving voltage line VDD through which a driving voltage is supplied, and a drain electrode may be connected to an output terminal OT. A source electrode of the second transistor T2 may be connected to a ground GND, and a drain electrode may be connected to the output terminal OT.

When a first logic level voltage is applied through the input terminal IT, the first transistor T1 may be turned on, and the second transistor T2 may be turned off. Therefore, the driving voltage of the driving voltage line VDD may be output to the output terminal OT through the first transistor T1. When a second logic level voltage having a level higher than that of the first logic level voltage is applied through the input terminal IT, the second transistor T2 may be turned on, and the first transistor T1 may be turned off. Therefore, the output terminal OT may be connected to the ground GND through the second transistor T2, and thus, the output terminal OT may be discharged to a ground voltage.

That is, the first transistor T1 may have the P-type semiconductor characteristic, the second transistor T2 may have the N-type semiconductor characteristic, and the gate electrode of the first transistor T1 and the gate electrode of the second transistor T2 may be connected to the same input terminal, whereby the first transistor T1 and the second transistor T2 may be complementarily turned on and turned off in the CMOS circuit.

As described above, the display device may include both of the P-type TFT and the N-type TFT for driving, but in this case, a manufacturing process is complicated. However, in an embodiment of the present disclosure, the CMOS circuit may be implemented with one transistor including a P-type semiconductor layer and a N-type semiconductor layer, or the P-type transistor or the N-type transistor may be selectively implemented, thereby preventing the manufacturing process from being complicated.

Hereinafter, a TFT implemented as a CMOS circuit according to an embodiment of the present disclosure will be described in detail with reference to FIGS. 4 to 10, and a TFT selectively implemented as one of a P-type transistor and a N-type transistor according to another embodiment of the present disclosure will be described in detail with reference to FIGS. 11 and 12.

Figure 4:
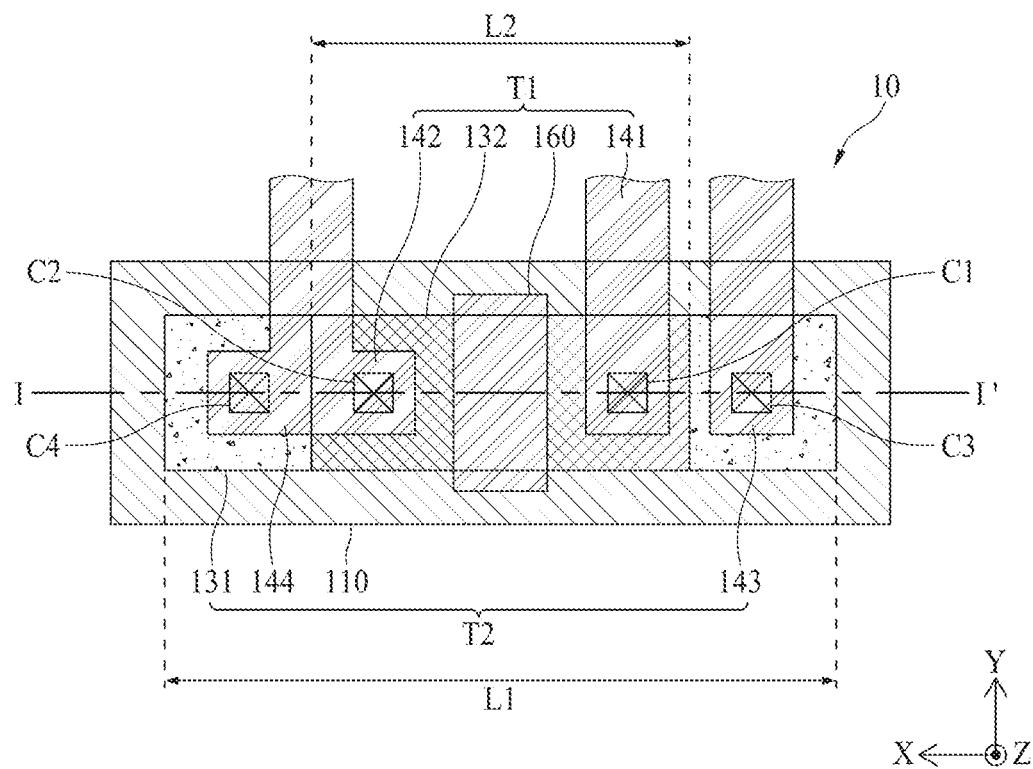
FIG. 4 is a plan view illustrating a TFT according to an embodiment of the present disclosure.
Figure 5:
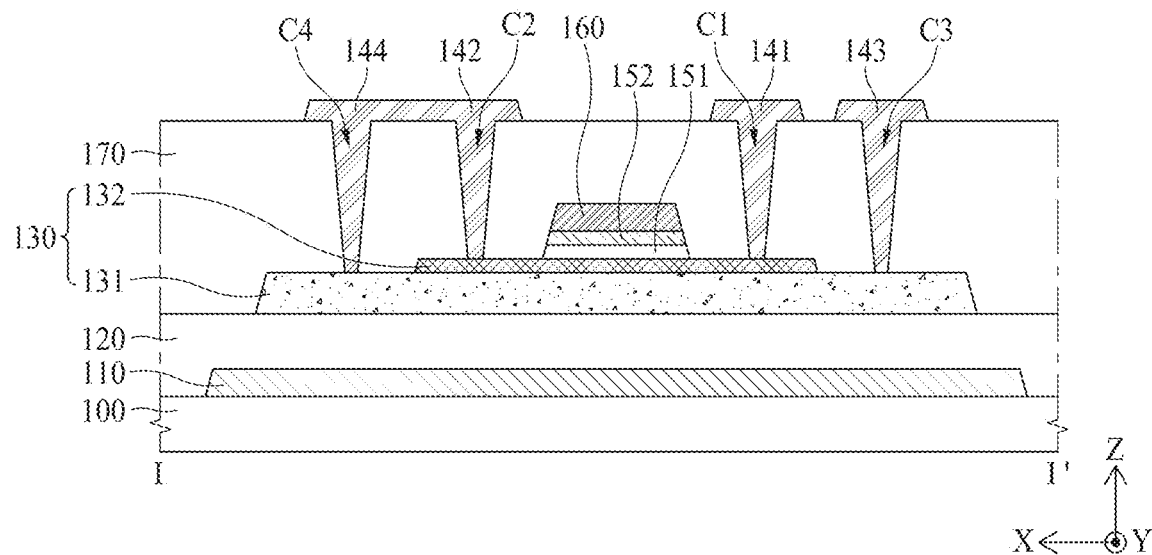
FIG. 5 is a cross-sectional view taken along line I-I' of FIG. 4.

FIG. 4 is a plan view illustrating a TFT 10 according to an embodiment of the present disclosure. FIG. 5 is a cross-sectional view taken along line I-I' of FIG. 4.

In FIG. 5, the TFT 10 according to an embodiment of the present disclosure is illustrated as being provided in a coplanar structure. The coplanar structure may have a top gate structure where a gate electrode is provided on an active layer.

Referring to FIGS. 4 and 5, the TFT 10 according to an embodiment of the present disclosure may include a bottom gate electrode 110, a semiconductor layer 130, a first source electrode 141, a first drain electrode 142, a second source electrode 143, a second drain electrode 144, and a top gate electrode 160. The semiconductor layer 130 may include a N-type semiconductor layer 131 and a P-type semiconductor layer 132.

The top gate electrode 160, the P-type semiconductor layer 132, the first source electrode 141, and the first drain electrode 142 may act as the first transistor T1 illustrated in FIG. 3, and the bottom gate electrode 110, the N-type semiconductor layer 131, the second source electrode 143, and the second drain electrode 144 may act as the second transistor T2 illustrated in FIG. 3. That is, the TFT 10 according to an embodiment of the present disclosure may include the N-type semiconductor layer 131 and the P-type semiconductor layer 132, and thus, may have both of the N-type semiconductor characteristic and the P-type semiconductor characteristic.

The TFT 10 may be formed on a substrate 100. The substrate 100 may be formed of plastic, glass, and/or the like.

A buffer layer may be formed on the substrate 100, for protecting the TFT 10 from water penetrating through the substrate 100. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked.

The bottom gate electrode 110 of the TFT 10 may be formed on the substrate 100 or the buffer layer. The bottom gate electrode 110 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

A first gate insulation layer 120 may be formed on the bottom gate electrode 110. The first gate insulation layer 120 may be formed of an inorganic layer, and for example, may be formed of SiOx, SiNx, or a multilayer thereof.

The bottom gate electrode 110 may block light which is incident on the N-type semiconductor layer 131 from the substrate 100. That is, the N-type semiconductor layer 131 may be protected by the bottom gate electrode 110 from the light.

The semiconductor layer 130 may be formed on the first gate insulation layer 120. The semiconductor layer 130 may include the N-type semiconductor layer 131 and the P-type semiconductor layer 132. The N-type semiconductor layer 131 may be formed on the first gate insulation layer 120, and the P-type semiconductor layer 132 may be formed on the N-type semiconductor layer 131. The semiconductor layer 130 may overlap each of the bottom gate electrode 110 and the top gate electrode 160.

The N-type semiconductor layer 131 may be formed as a N-type oxide semiconductor layer, and the P-type semiconductor layer 132 may be formed as a P-type oxide semiconductor layer. If the N-type semiconductor layer 131 is the N-type oxide semiconductor layer, the N-type semiconductor layer 131 may be formed of Indium Gallium Zinc Oxide (IGZO), Indium Zinc Oxide (IZO), Indium Gallium Oxide (IGO), Indium Tin Zinc Oxide (ITZO), Gallium Tin Oxide (GTO), Zinc Tin Oxide (ZTO), Indium Aluminum Zinc Oxide (IAZO), Aluminum Zinc Oxide (AZO), Indium Tin Oxide (ITO), Antimony Tin Oxide (ATO), Gallium Zinc Oxide (GZO), and/or the like. If the P-type semiconductor layer 132 is the P-type oxide semiconductor layer, the P-type semiconductor layer 132 may be formed of $Cu_2O$, SnO, NiO, $CuMO_2$ (delafossite, M=Al, Ga, In, Sr, Y, Sc, and Cr), $ZnM_2O_4$ (spinel, M=Co, Rh, Ir), LnCuOCh (oxychalcogenide, Ln=lanthanoids (La~Lu), Ch=Se, S, and Te), or Cu-nanowire.

A length L1 of the N-type semiconductor layer 131 in a first direction (an X-axis direction) may be set longer than a length L2 of the P-type semiconductor layer 132 in the first direction (the X-axis direction). Therefore, a portion of the N-type semiconductor layer 131 may not be covered by the P-type semiconductor layer 132. Therefore, the second source electrode 143 and the second drain electrode 144 may be connected to the portion of the N-type semiconductor layer 131 uncovered by the P-type semiconductor layer 132.

In FIG. 4, an example where a length of the N-type semiconductor layer 131 in a second direction (a Y-axis direction) is set substantially equal to that of the P-type semiconductor layer 132 in the second direction (the Y-axis direction) is illustrated, but the present embodiment is not limited thereto. In other embodiments, the length of the N-type semiconductor layer 131 in the second direction (the Y-axis direction) may be set longer than that of the P-type semiconductor layer 132 in the second direction (the Y-axis direction).

A second gate insulation layer 151 and a third gate insulation layer 152 may be formed on the P-type semiconductor layer 132. Each of the second gate insulation layer 151 and the third gate insulation layer 152 may be formed of an inorganic layer, and for example, may be formed of SiOx, SiNx, or a multilayer thereof. The third gate insulation layer 152 may be omitted.

The top gate electrode 160 may be formed on the third gate insulation layer 152. The top gate electrode 160 may be formed of a single layer or a multilayer which includes one of Mo, Al, Cr, Au, Ti, Ni, Nd, and Cu, or an alloy thereof.

In FIG. 4, an example where a length of the top gate electrode 160 in the second direction (the Y-axis direction) is set longer than that of the P-type semiconductor layer 132 in the second direction (the Y-axis direction) is illustrated, but the present embodiment is not limited thereto. In other embodiments, the length of the top gate electrode 160 in the second direction (the Y-axis direction) may be set substantially equal to or shorter than that of the P-type semiconductor layer 132 in the second direction (the Y-axis direction). As the length of the top gate electrode 160 in the second direction (the Y-axis direction) increases, a channel region of the P-type semiconductor layer 132 may be widely provided, and thus, based on this, the length of the top gate electrode 160 in the second direction (the Y-axis direction) may be designed.

An interlayer insulation layer 170 may be formed on the first gate insulation layer 120, the N-type semiconductor layer 131, the P-type semiconductor layer 132, and the top gate electrode 160. The interlayer insulation layer 170 may be formed of an inorganic layer, and for example, may be formed of SiOx, SiNx, or a multilayer thereof.

A first contact hole C1 and a second contact hole C2, which pass through the interlayer insulation layer 170 to expose the P-type semiconductor layer 132, may be formed in the interlayer insulation layer 170, and a third contact hole C3 and a fourth contact hole C4, which pass through the interlayer insulation layer 170 to expose the N-type semiconductor layer 131, may be formed in the interlayer insulation layer 170. In detail, a portion of the N-type semiconductor layer 131 uncovered by the P-type semiconductor layer 132 may be exposed by the third contact hole C3 and the fourth contact hole C4.

The first source electrode 141, the first drain electrode 142, the second source electrode 143, and the second drain electrode 144 may be formed on the interlayer insulation layer 170. The first source electrode 141 may be connected to the P-type semiconductor layer 132 through the first contact hole C1. The first drain electrode 142 may be connected to the P-type semiconductor layer 132 through the second contact hole C2. The second source electrode 143 may be connected to, through the third contact hole C3, the portion of the N-type semiconductor layer 131 uncovered by the P-type semiconductor layer 132. The second drain electrode 144 may be connected to, through the fourth contact hole C4, the portion of the N-type semiconductor layer 131 uncovered by the P-type semiconductor layer 132. The first contact hole C1 and the second contact hole C2 may be disposed between the third contact hole C3 and the fourth contact hole C4.

The first source electrode 141 and the first drain electrode 142 may be connected to the P-type semiconductor layer 132 having a length shorter than that of the N-type semiconductor layer 131 in the first direction (the X-axis direction), and thus, an interval between the first source electrode 141 and the first drain electrode 142 may be shorter than an interval between the second source electrode 143 and the second drain electrode 144.

The first drain electrode 142 may be connected to the second drain electrode 144, and in this case, the TFT 10 may function as a CMOS.

Figure 6:
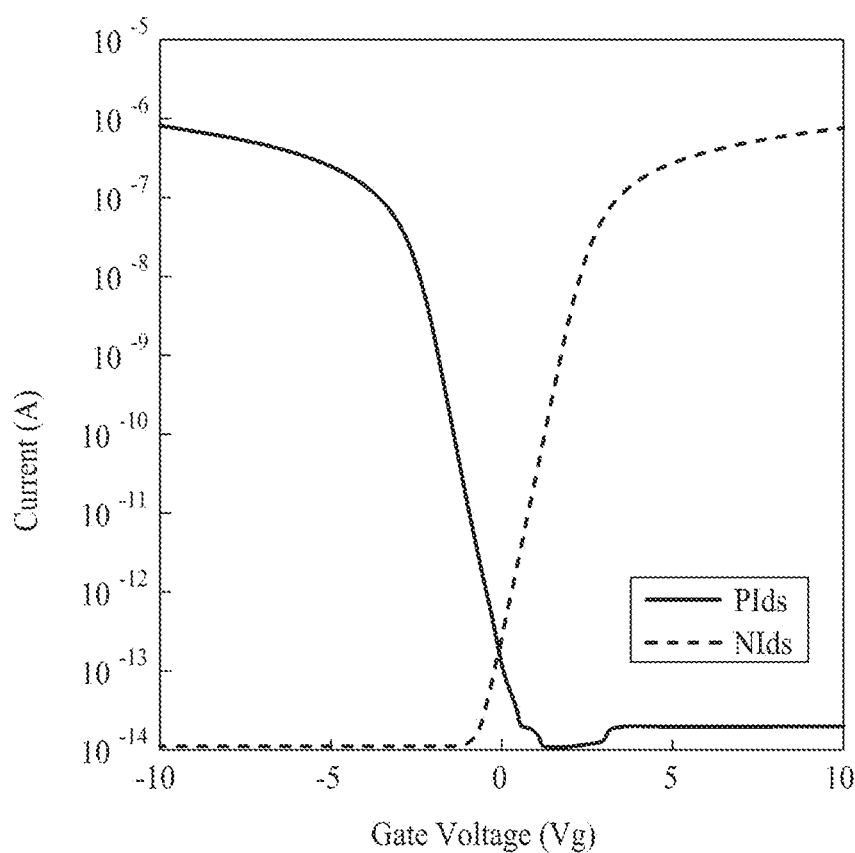
FIG. 6 is a graph showing a N-type semiconductor characteristic and a P-type semiconductor characteristic of a TFT according to an embodiment of the present disclosure.
Figure 7A:
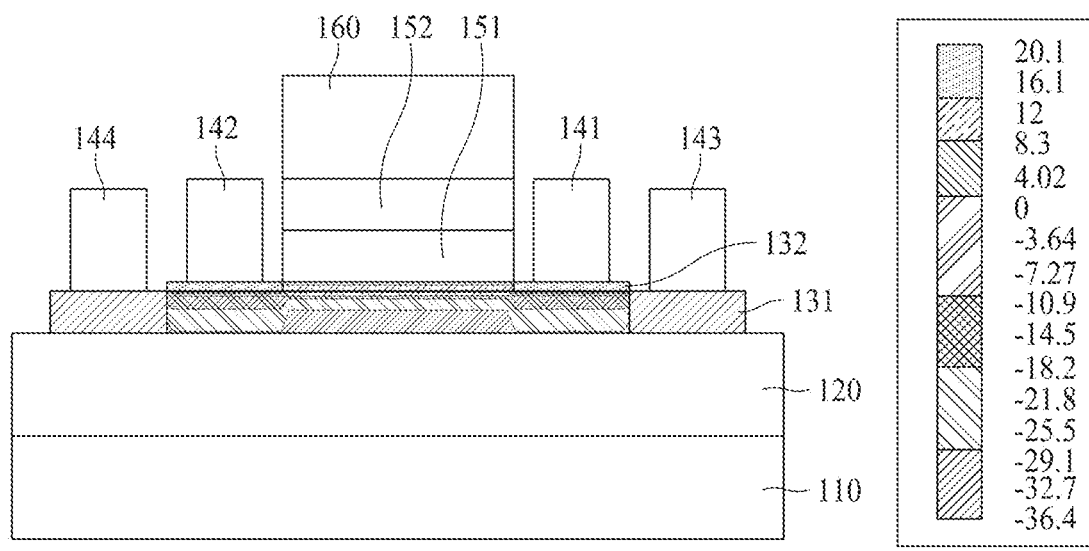
FIGS. 7A and 7B are exemplary diagrams showing a hole concentration when a N-type semiconductor characteristic of a TFT according to an embodiment of the present disclosure is implemented and an electron concentration when a P-type semiconductor characteristic of the TFT is implemented.
Figure 7B:
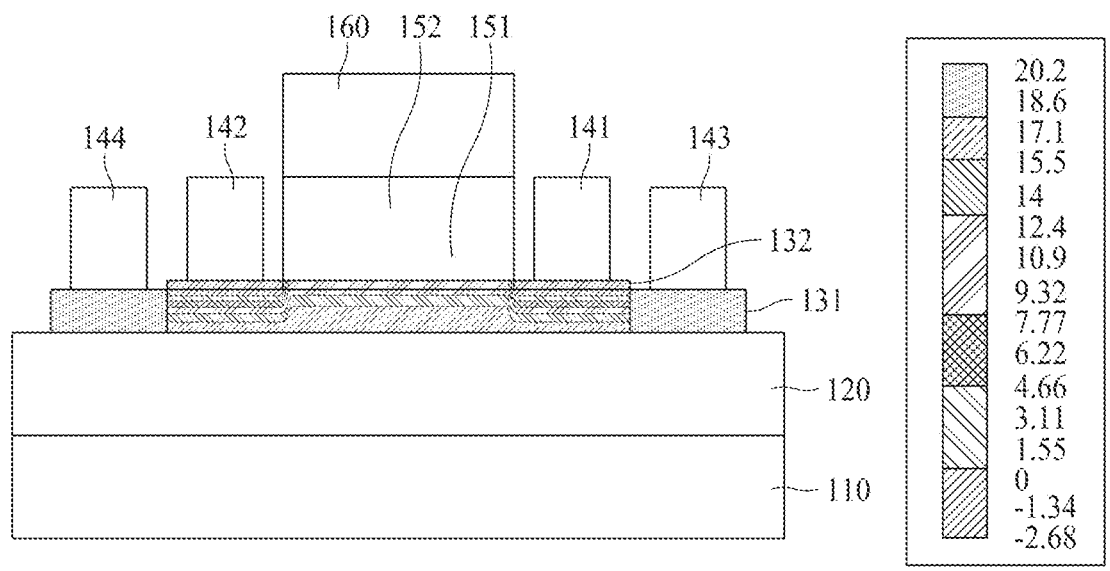

FIG. 6 is a graph showing the N-type semiconductor characteristic and the P-type semiconductor characteristic of the TFT according to an embodiment of the present disclosure. FIGS. 7A and 7B are exemplary diagrams showing a hole concentration when the N-type semiconductor characteristic of the TFT according to an embodiment of the present disclosure is implemented and an electron concentration when the P-type semiconductor characteristic of the TFT is implemented.

In FIGS. 6, 7A, and 7B, an example where the N-type semiconductor layer 131 is formed of IGZO and the P-type semiconductor layer 132 is formed of $Cu_2O$ will be described below.

In FIG. 6, a current NIds which flows in the N-type semiconductor layer 131 with a voltage applied to the bottom gate electrode 110 and a current PIds which flows in the P-type semiconductor layer 132 with a voltage applied to the top gate electrode 160 are shown. In FIG. 6, the X axis represents a gate voltage Vg, and the Y axis represents a value of a current (hereinafter referred to as a current value) A.

FIG. 7A shows a hole concentration when the gate voltage Vg is −10 V in FIG. 6 (i.e., the current PIds flowing in the P-type semiconductor layer 132 is saturated). FIG. 7B shows an electron concentration when the gate voltage Vg is +10 V in FIG. 6 (i.e., the current NIds flowing in the N-type semiconductor layer 131 is saturated).

Referring to FIG. 6, if the gate voltage Vg applied to the bottom gate electrode 110 is a negative voltage, a current hardly flows in the N-type semiconductor layer 131. Also, if the gate voltage Vg applied to the bottom gate electrode 110 is a positive voltage, the current NIds flowing in the N-type semiconductor layer 131 increases in proportion to the gate voltage Vg. Also, if the current NIds flowing in the N-type semiconductor layer 131 is saturated as in FIG. 7B, the electron concentration is highest in a lower portion of the N-type semiconductor layer 131 close to the bottom gate electrode 110. Accordingly, it may be considered that the N-type semiconductor layer 131 has the N-type semiconductor characteristic.

If the gate voltage Vg applied to the top gate electrode 160 is a positive voltage, a current hardly flows in the P-type semiconductor layer 132. Also, if the gate voltage Vg applied to the top gate electrode 160 is a negative voltage, the current PIds flowing in the P-type semiconductor layer 132 increases as the gate voltage Vg is lowered. Also, if the current PIds flowing in the P-type semiconductor layer 132 is saturated as in FIG. 7A, the hole concentration is highest in the P-type semiconductor layer 132. Accordingly, it may be considered that the P-type semiconductor layer 132 has the P-type semiconductor characteristic.

If the P-type semiconductor layer 132 is formed on the N-type semiconductor layer 131, depletion can occur in an active area of each of the N-type semiconductor layer 131 and the P-type semiconductor layer 132, and thus, the control of a carrier concentration is important for realizing a device characteristic. To this end, a thickness of the P-type semiconductor layer 132 may be set thinner than that of the N-type semiconductor layer 131. In this case, a carrier concentration of the N-type semiconductor layer 131 may be adjusted to about $5 \times e^{17}/cm^3$, and a carrier concentration of the P-type semiconductor layer 132 may be adjusted to about $1 \times e^{18}/cm^3$.

Figure 8:
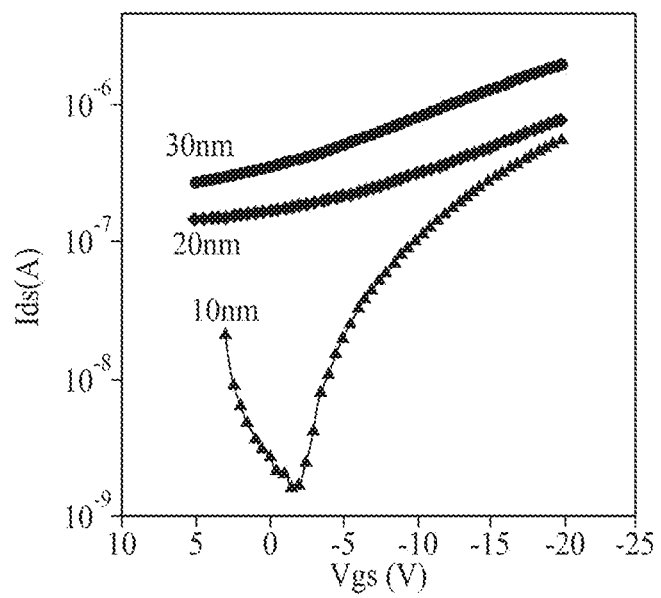
FIG. 8 is a graph showing the P-type semiconductor properties in accordance with the thickness of the P-type semiconductor layer.

FIG. 8 is a graph showing the P-type semiconductor properties in accordance with the thickness of the P-type semiconductor layer. FIG. 8 shows the current value (Ids) of a p-type channel area in accordance with the gate-source voltage (Vgs), on assumption that a drain-source voltage is −20V, when the thickness of the P-type semiconductor layer 132 is 10 nm, 20 nm, or 30 nm and the thickness of the N-type semiconductor layer 131 is 30 nm. In FIG. 8, the X-axis indicates the gate-source voltage (Vgs), and the Y-axis indicates the current value (Ids) of the p-type channel area.

Referring to FIG. 8, when the thickness of the P-type semiconductor layer 132 is 20 nm or 30 nm, the current continuously flows despite the change in the gate-source voltage (Vgs), so that it is difficult to realize the P-type semiconductor properties. That is, when the thickness of the P-type semiconductor layer 132 is 20 nm or 30 nm, the P-type semiconductor layer 132 does not have the P-type semiconductor properties.

Meanwhile, if the thickness of the P-type semiconductor layer 132 is 10 nm, the off-current properties is shown when the gate-source voltage (Vgs) is near 0V. That is, if the thickness of the P-type semiconductor layer 132 is 10 nm, it is possible to realize the P-type semiconductor properties.

Therefore, the thin film transistor 10 according to one embodiment of the present disclosure may realize the P-type semiconductor properties when the thickness of the P-type semiconductor layer 132 may be less than the thickness of the N-type semiconductor layer 131.

As described above, according to an embodiment of the present disclosure, the N-type semiconductor layer 131 may be formed on the bottom gate electrode 110, the P-type semiconductor layer 132 may be formed on the N-type semiconductor layer 131, the top gate electrode 160 may be formed on the P-type semiconductor layer 132, and the length L1 of the N-type semiconductor layer 131 in the first direction (the X-axis direction) may be set longer than the length L2 of the P-type semiconductor layer 132 in the first direction (the X-axis direction). Therefore, the first source electrode 141 and the first drain electrode 142 may be connected to the P-type semiconductor layer 132, and the second source electrode 143 and the second drain electrode 144 may be connected to a portion of the N-type semiconductor layer 131 uncovered by the P-type semiconductor layer 132. As a result, in an embodiment of the present disclosure, when a positive voltage is applied to the bottom gate electrode 110, the N-type semiconductor layer 131 may be configured to have the N-type semiconductor characteristic, and when a negative voltage is applied to the top gate electrode 160, the P-type semiconductor layer 132 may be configured to have the P-type semiconductor characteristic.

Figure 9:
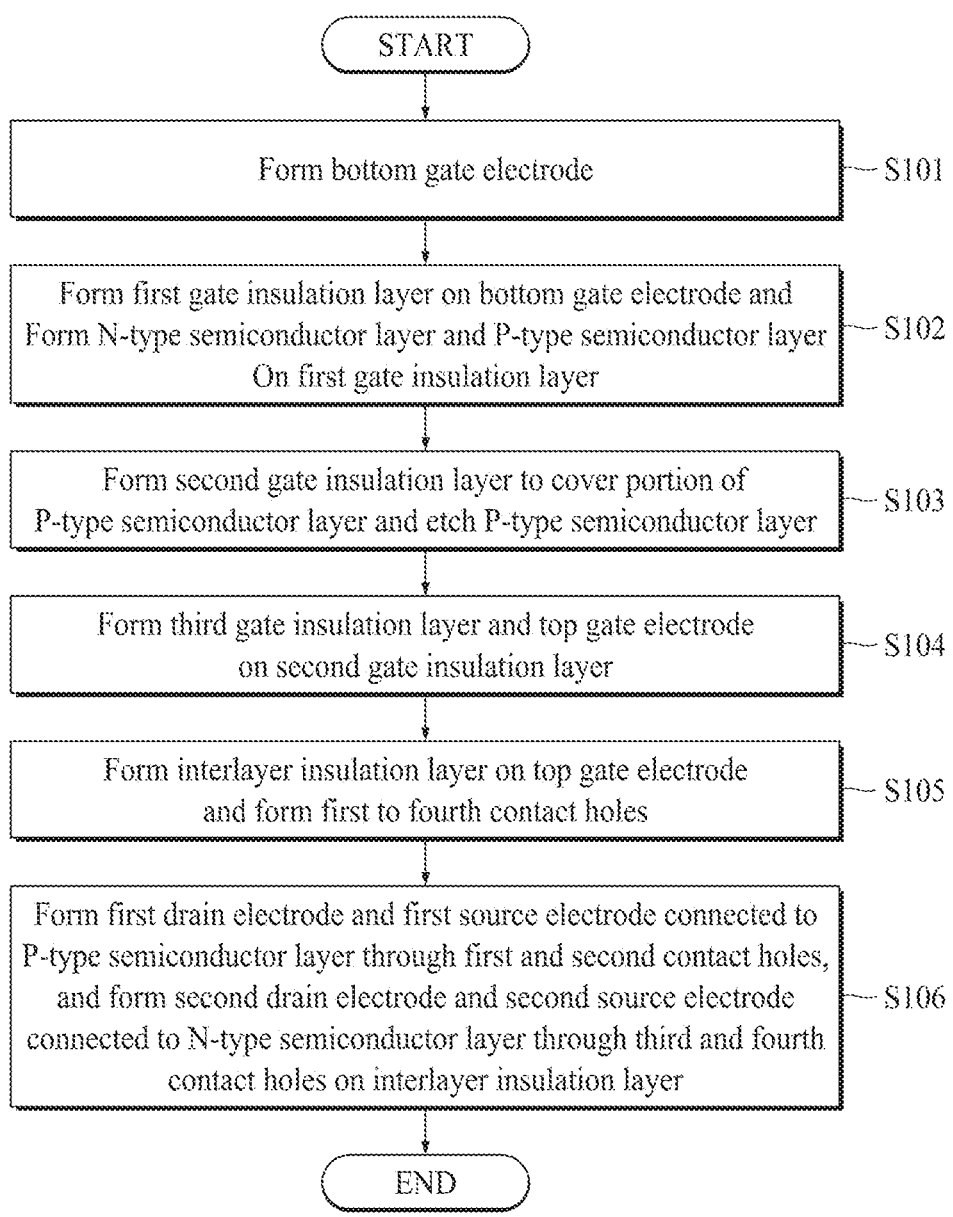
FIG. 9 is a flowchart illustrating a method of manufacturing a TFT according to an embodiment of the present disclosure.

FIG. 9 is a flowchart illustrating a method of manufacturing a TFT according to an embodiment of the present disclosure. FIGS. 10A to 10F are cross-sectional views for describing a method of manufacturing a TFT according to an embodiment of the present disclosure.

The cross-sectional views illustrated in FIGS. 10A to 10F relate to a method of manufacturing the TFT illustrated in FIG. 4, and thus, like reference numerals refer to like elements. Hereinafter, a method of manufacturing a TFT according to an embodiment of the present disclosure will be described in detail with reference to FIGS. 9 and 10A to 10F.

The method of manufacturing a thin film transistor according to an embodiment of the present disclosure comprises: forming a bottom gate electrode on a substrate; forming a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer; forming a first source electrode and a first drain electrode respectively connected to the P-type semiconductor layer; forming a second source electrode and a second drain electrode respectively connected to a portion of the N-type semiconductor layer which is not overlapped with the P-type semiconductor layer; and forming a top gate electrode above the semiconductor layer.

Figure 10A:
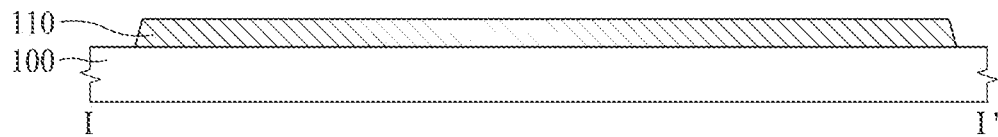
FIGS. 10A to 10F are cross-sectional views for describing a method of manufacturing a TFT according to an embodiment of the present disclosure.

First, as in FIG. 10A, a bottom gate electrode 110 may be formed on a substrate 100. In detail, a first metal layer may be formed on a whole upper surface of the substrate 100 through a sputtering process. Subsequently, a photoresist pattern may be formed on the first metal layer, and then, by patterning the first metal layer through a mask process of etching the first metal layer, the bottom gate electrode 110 may be formed. The bottom gate electrode 110 may be formed of a single layer or a multilayer which includes one of Mo, Al, Cr, Au, Ti, Ni, Nd, and Cu, or an alloy thereof.

A buffer layer may be formed on the substrate 100, for protecting a TFT 10 from water penetrating through the substrate 100. The bottom gate electrode 110 may be formed on the buffer layer. The buffer layer may include a plurality of inorganic layers which are alternately stacked. For example, the buffer layer may be formed of a multilayer where one or more inorganic layers of SiOx, SiNx, and SiON are alternately stacked. The buffer layer may be formed through a plasma enhanced chemical vapor deposition (PECVD) process. (S101 of FIG. 9)

Figure 10B:
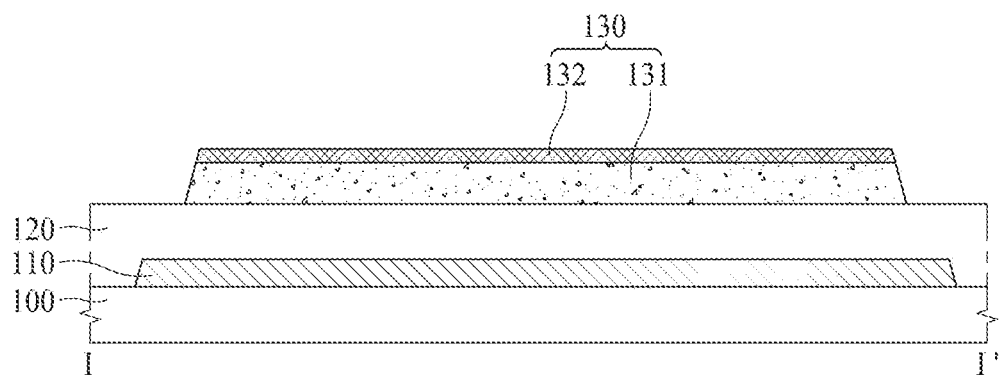

Second, as in FIG. 10B, a first gate insulation layer 120 may be formed on the bottom gate electrode 110. The first gate insulation layer 120 may be formed of an inorganic layer, and for example, may be formed of SiOx, SiNx, or a multilayer thereof. The first gate insulation layer 120 may be formed through a PECVD process.

Subsequently, a semiconductor layer 130 including a N-type semiconductor layer 131 and a P-type semiconductor layer 132 may be formed on the first gate insulation layer 120.

By using a sputtering process or a metal organic chemical vapor deposition (MOCVD) process, a first semiconductor layer may be formed on a whole upper surface of the first gate insulation layer 120, and then, a second semiconductor layer may be formed on a whole upper surface of the first semiconductor layer. Subsequently, the N-type semiconductor layer 131 and the P-type semiconductor layer 132 may be formed by simultaneously patterning the first and second semiconductor layers through a mask process using a photoresist pattern. The N-type semiconductor layer 131 may overlap the bottom gate electrode 110.

The N-type semiconductor layer 131 and the P-type semiconductor layer 132 may each be formed as an oxide semiconductor layer. In this case, the N-type semiconductor layer 131 may be formed of IGZO, IZO, IGO, ITZO, GTO, ZTO, IAZO, AZO, ITO, ATO, GZO, and/or the like, and the P-type semiconductor layer 132 may be formed of $Cu_2O$, SnO, NiO, $CuMO_2$ (delafossite, M=Al, Ga, In, Sr, Y, Sc, and Cr), $ZnM_2O_4$ (spinel, M=Co, Rh, Ir), LnCuOCh (oxychalcogenide, Ln=lanthanoids (La~Lu), Ch=Se, S, and Te), or Cu-nanowire. Hereinafter, an example where the P-type semiconductor layer 132 is formed of $Cu_2O$ will be described.

If the P-type semiconductor layer 132 is formed of $Cu_2O$, the N-type semiconductor layer 131 and the P-type semiconductor layer 132 should be formed under a condition where a vacuum state is maintained, in order for the TFT 10 to have both of the N-type semiconductor characteristic and the P-type semiconductor characteristic. That is, the N-type semiconductor layer 131 and the P-type semiconductor layer 132 may be continuously deposited in one chamber while the vacuum state is being maintained. For example, a vacuum of 5 mTorr to 10 mTorr may be maintained when forming the N-type semiconductor layer 131 and the P-type semiconductor layer 132.

If the vacuum state is not maintained when forming the N-type semiconductor layer 131 and the P-type semiconductor layer 132, the N-type semiconductor layer 131 can be oxidized by oxygen in the atmosphere. In this case, an interface between the N-type semiconductor layer 131 and the P-type semiconductor layer 132 can be unstable. Also, if the vacuum state is not maintained when forming the N-type semiconductor layer 131 and the P-type semiconductor layer 132, the P-type semiconductor layer 132 can be formed of CuO instead of $Cu_2O$, due to oxygen in the atmosphere.

In a case of forming the P-type semiconductor layer 132 by using $Cu_2O$ as a target, an oxygen tension may be adjusted to 3% or less. In this case, if the oxygen tension exceeds 3%, the P-type semiconductor layer 132 may be formed of CuO instead of $Cu_2O$. Also, in a case where the P-type semiconductor layer 132 is formed through an $O_2$ reaction by using Cu as a target, the oxygen tension may be adjusted to 40% or more.

In a case where the P-type semiconductor layer 132 is formed of CuO, electron mobility is more reduced than a case where the P-type semiconductor layer 132 is formed of $Cu_2O$. That is, in a case where the P-type semiconductor layer 132 is formed of CuO, an electron mobility of the P-type semiconductor layer 132 may be 1 $cm^2/Vs$ or less and may be very low. For this reason, the TFT 10 is difficult to realize the P-type semiconductor characteristic.

In order to substitute the P-type semiconductor layer 132 including CuO with $Cu_2O$, thermal treatment may be performed at a high temperature. For example, thermal treatment may be performed on the P-type semiconductor layer 132 including CuO for 30 minutes or more at a high temperature of 300 degrees C. or more in a vacuum state. However, if thermal treatment is performed at a high temperature in a vacuum state, oxygen is desorbed from the N-type semiconductor layer 131, and thus, a conductivity of the N-type semiconductor layer 131 increases. Therefore, even when a gate voltage Vg applied to the bottom gate electrode 110 is a negative voltage, a current NIds can flow in the N-type semiconductor layer 131. That is, a problem where an off current increases can occur.

The N-type semiconductor layer 131 may be formed in a state where oxygen is plentiful. For example, when forming the N-type semiconductor layer 131, an oxygen tension may be adjusted to 3% to 10%. However, based on a material of the N-type semiconductor layer 131, if it is required to enhance electron mobility, the oxygen tension necessary for forming the N-type semiconductor layer 131 may be adjusted to 0% to 3%.

The N-type semiconductor layer 131 may have a thickness of 30 nm or less, for enhancing electron mobility. Also, in a case where a thickness of the P-type semiconductor layer 132 is adjusted to 10 nm or less, the turn-off of a p-type channel region is controlled as shown in FIG. 8, and moreover, the P-type semiconductor layer 132 is easily formed of $Cu_2O$. Therefore, the thickness of the P-type semiconductor layer 132 may be adjusted to 10 nm or less. (S102 of FIG. 9)

Figure 10C:
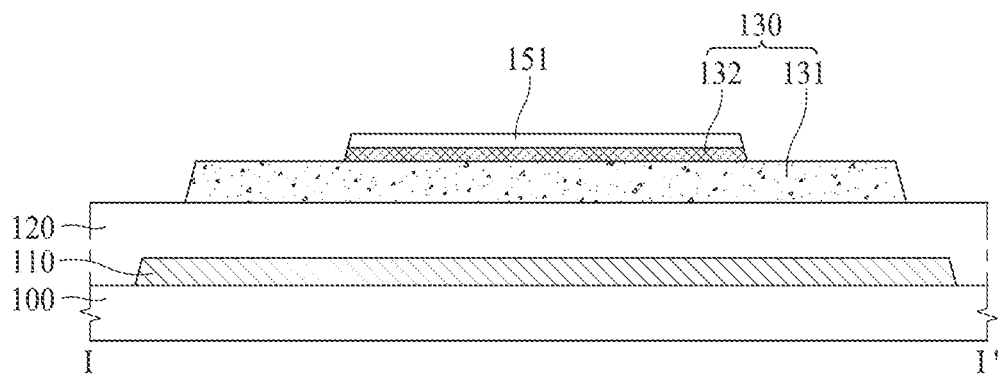

Third, as in FIG. 10C, a second gate insulation layer 151 may be formed to cover a portion of the P-type semiconductor layer 132, and a portion of the P-type semiconductor layer 132 uncovered by the second gate insulation layer 151 may be etched by using the second gate insulation layer 151 as a passivation layer. Therefore, a length L1 of the N-type semiconductor layer 131 in a first direction (an X-axis direction) may be set longer than a length L2 of the P-type semiconductor layer 132 in the first direction (the X-axis direction). (S103 of FIG. 9)

Figure 10D:
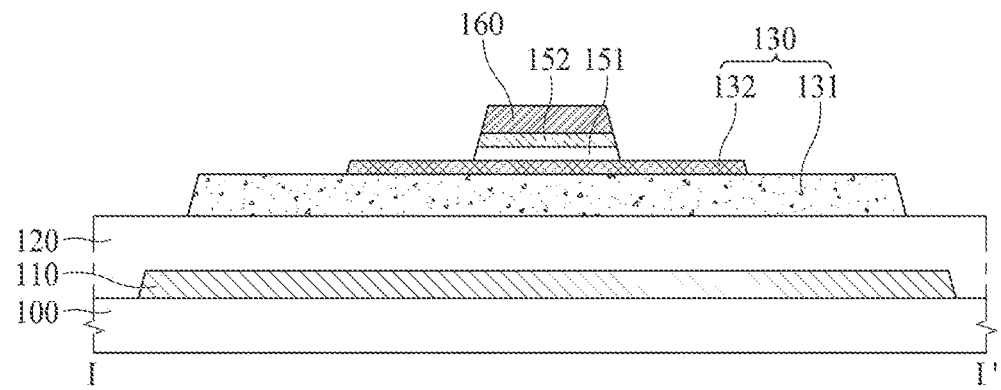

Fourth, as in FIG. 10D, a third gate insulation layer 152 may be formed on the second gate insulation layer 151, and a top gate electrode 160 may be formed on the third gate insulation layer 152.

In detail, the third gate insulation layer 152 may be formed on a whole upper surface of the second gate insulation layer 151 through a PECVD process. Subsequently, a second metal layer may be formed on a whole upper surface of the third gate insulation layer 152 through a sputtering process or an MOCVD process. Subsequently, the second gate insulation layer 151, the third gate insulation layer 152, and the top gate electrode 160 may be finished by simultaneously patterning the second gate insulation layer 151, the third gate insulation layer 152, and the second metal layer through a mask process using a photoresist pattern. The top gate electrode 160 may overlap the P-type semiconductor layer 132. The third gate insulation layer 152 may be omitted. (S104 of FIG. 9)

Figure 10E:
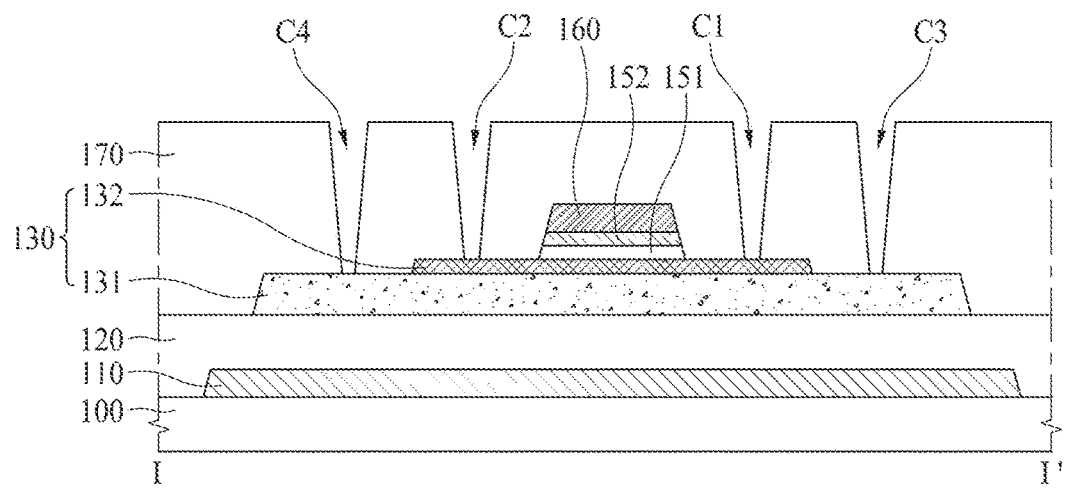

Fifth, as in FIG. 10E, an interlayer insulation layer 170 may be formed on the N-type semiconductor layer 131, the P-type semiconductor layer 132, and the top gate electrode 160. The interlayer insulation layer 170 may be formed through a PECVD process.

Subsequently, a first contact hole C1 and a second contact hole C2, which pass through the interlayer insulation layer 170 to expose the P-type semiconductor layer 132, may be formed, and a third contact hole C3 and a fourth contact hole C4, which expose a portion of the N-type semiconductor layer 131 uncovered by the P-type semiconductor layer 132, may be formed. (S105 of FIG. 9)

Figure 10F:
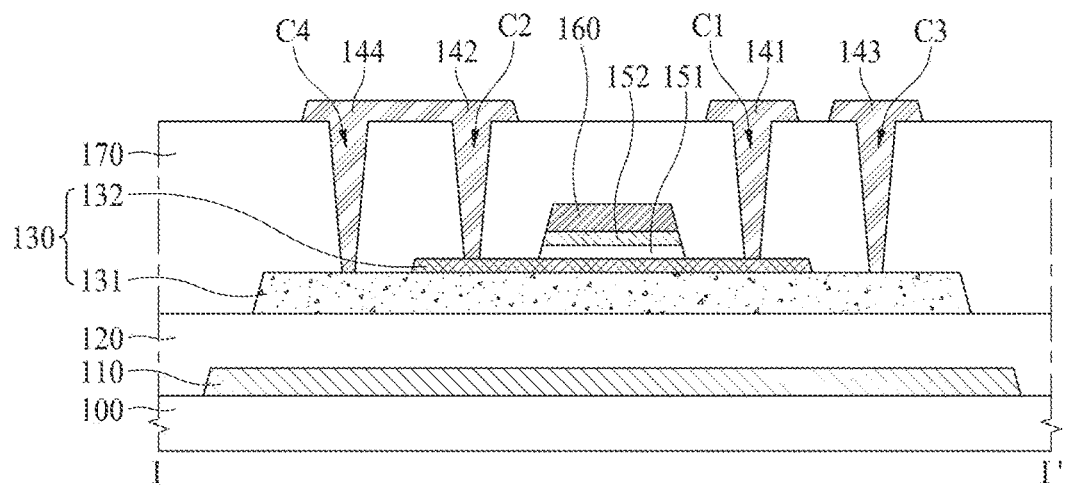

Sixth, as in FIG. 10F, first and second source electrodes 141 and 143 and first and second drain electrodes 142 and 144 may be formed on the interlayer insulation layer 170.

In detail, a third metal layer may be formed on a whole upper surface of the interlayer insulation layer 170 through a sputtering process or an MOCVD process. Subsequently, the first and second source electrodes 141 and 143 and the first and second drain electrodes 142 and 144 may be formed by patterning the third metal layer through a mask process using a photoresist pattern.

The first source electrode 141 may be connected to the P-type semiconductor layer 132 through the first contact hole C1. The first drain electrode 142 may be connected to the P-type semiconductor layer 132 through the second contact hole C2. The second source electrode 143 may be connected to, through the third contact hole C3, a portion of the N-type semiconductor layer 131 uncovered by the P-type semiconductor layer 132. The second drain electrode 144 may be connected to, through the fourth contact hole C4, the portion of the N-type semiconductor layer 131 uncovered by the P-type semiconductor layer 132.

The first drain electrode 142 may be connected to the second drain electrode 144, and in this case, the TFT 10 may function as a CMOS.

The first and second source electrodes 141 and 143 and the first and second drain electrodes 142 and 144 may each be formed of a single layer or a multilayer which includes one of Mo, Al, Cr, Au, Ti, Ni, Nd, and Cu, or an alloy thereof. Also, the first source electrode 141 and the first drain electrode 142 may be connected to the P-type semiconductor layer 132, and thus, based on this, the first source electrode 141 and the first drain electrode 142 may each be formed of a single layer or a multilayer which includes one of palladium (Pd) having a work function of 5.22 eV to 5.6 eV, platinum (Pt) having a work function of 5.12 eV to 5.93 eV, gold (Au) having a work function of 5.1 eV to 5.47 eV, and nickel (Ni) having a work function of 5.04 eV to 5.35 eV, which have a work function higher than 5.0 eV, or an alloy thereof (S106 of FIG. 9)

As described above, according to an embodiment of the present disclosure, the N-type semiconductor layer 131 and the P-type semiconductor layer 132 may be formed through a continuous deposition process in one chamber while maintaining a vacuum state. As a result, according to an embodiment of the present disclosure, an interface between the N-type semiconductor layer 131 and the P-type semiconductor layer 132 may be stably formed, and moreover, the N-type semiconductor layer 131 and the P-type semiconductor layer 132 may each be formed of $Cu_2O$ instead of CuO. That is, according to an embodiment of the present disclosure, a TFT which includes the N-type semiconductor layer 131 having the N-type semiconductor characteristic and the P-type semiconductor layer 132 having the P-type semiconductor characteristic may be manufactured.

Figure 11:
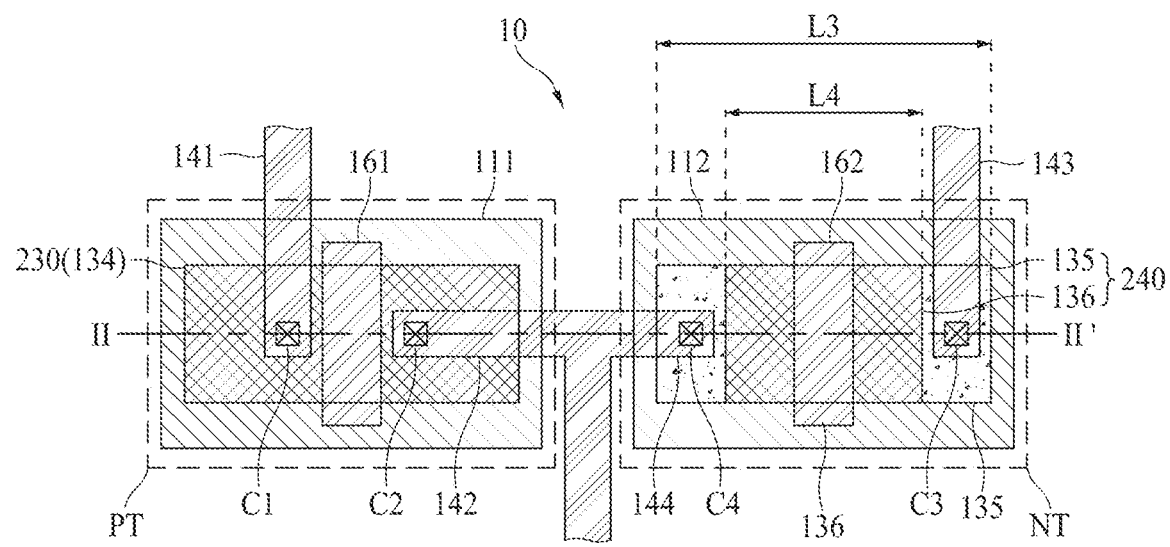
FIG. 11 is a plan view illustrating a TFT according to another embodiment of the present disclosure.

FIG. 11 is a plan view illustrating a TFT 10 according to another embodiment of the present disclosure. FIG. 12 is a cross-sectional view taken along line II-II' of FIG. 11.

In FIG. 11, the TFT 10 according to another embodiment of the present disclosure is illustrated as being provided in a coplanar structure. The coplanar structure may have a top gate structure where a gate electrode is provided on an active layer.

Figure 12:
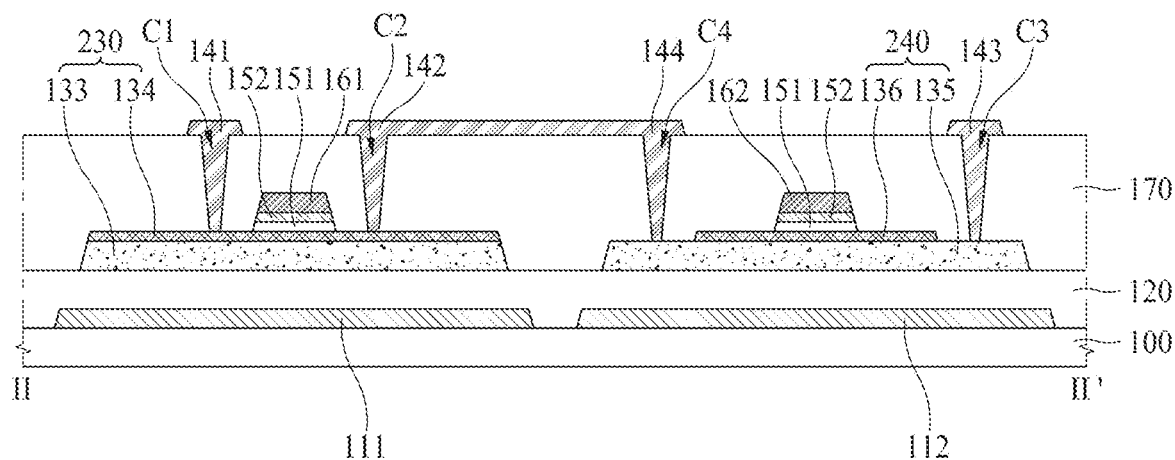
FIG. 12 is a cross-sectional view taken along line II-II' of FIG. 11.

Referring to FIGS. 11 and 12, the TFT 10 according to another embodiment of the present disclosure may include a P-type TFT PT having the P-type semiconductor characteristic and a N-type TFT NT having the N-type semiconductor characteristic.

The P-type TFT PT may include a first bottom gate electrode 111, a first semiconductor layer 230, a first source electrode 141, a first drain electrode 142, and a first top gate electrode 161. The first semiconductor layer 230 may include a first N-type semiconductor layer 133 and a first P-type semiconductor layer 134. When a voltage is applied to the first top gate electrode 161, the TFT 10 is selectively implemented as a P-type TFT. In the P-type TFT PT, a voltage may not be applied to the first bottom gate electrode 111, and thus, the first bottom gate electrode 111 may act as a light blocking layer which blocks light incident on the first N-type semiconductor layer 133 through a substrate 100.

The N-type TFT NT may include a second bottom gate electrode 112, a second semiconductor layer 240, a second source electrode 143, a second drain electrode 144, and a second top gate electrode 162. The second semiconductor layer 240 may include a second N-type semiconductor layer 135 and a second P-type semiconductor layer 136. When a voltage is applied to the second bottom gate electrode 112, the TFT 10 is selectively implemented as a N-type TFT. In the N-type TFT NT, a voltage may not be applied to the second top gate electrode 162, and thus, the second top gate electrode 162 may be omitted.

The TFT 10 may be formed on the substrate 100. The substrate 100 may be formed of plastic, glass, and/or the like.

A buffer layer may be formed on the substrate 100, for protecting the TFT 10 from water penetrating through the substrate 100. The buffer layer may include a plurality of inorganic layers which are alternately stacked. For example, the buffer layer may be formed of a multilayer where one or more inorganic layers of SiOx, SiNx, and SiON are alternately stacked.

The first bottom gate electrode 111 and the second bottom gate electrode 112 may be formed on the substrate 100 or the buffer layer. The first bottom gate electrode 111 and the second bottom gate electrode 112 may each be formed of a single layer or a multilayer which includes one of Mo, Al, Cr, Au, Ti, Ni, Nd, and Cu, or an alloy thereof.

A first gate insulation layer 120 may be formed on the first bottom gate electrode 111 and the second bottom gate electrode 112. The first gate insulation layer 120 may be formed of an inorganic layer, and for example, may be formed of SiOx, SiNx, or a multilayer thereof.

The first bottom gate electrode 111 and the second bottom gate electrode 112 may block light which is incident on the first and second N-type semiconductor layers 133 and 135 from the substrate 100. That is, the first and second N-type semiconductor layers 133 and 135 may be protected by the first bottom gate electrode 111 and the second bottom gate electrode 112 from the light.

The first N-type semiconductor layer 133 and the second N-type semiconductor layer 135 may be formed on the first gate insulation layer 120. The first P-type semiconductor layer 134 may be formed on the first N-type semiconductor layer 133, and the second P-type semiconductor layer 136 may be formed on the second N-type semiconductor layer 135. The first N-type semiconductor layer 133 and the first P-type semiconductor layer 134 may overlap the first bottom gate electrode 111 and the first top gate electrode 161. The second N-type semiconductor layer 135 and the second P-type semiconductor layer 136 may overlap the second bottom gate electrode 112.

The first N-type semiconductor layer 133 and the second N-type semiconductor layer 135 may each be formed as a N-type oxide semiconductor layer, and the first P-type semiconductor layer 134 and the second P-type semiconductor layer 136 may each be formed as a P-type oxide semiconductor layer. If each of the first N-type semiconductor layer 133 and the second N-type semiconductor layer 135 is the N-type oxide semiconductor layer, the first N-type semiconductor layer 133 and the second N-type semiconductor layer 135 may be formed of IGZO, IZO, IGO, ITZO, GTO, ZTO, IAZO, AZO, ITO, ATO, GZO, and/or the like. If each of the first P-type semiconductor layer 134 and the second P-type semiconductor layer 136 is the P-type oxide semiconductor layer, the first P-type semiconductor layer 134 and the second P-type semiconductor layer 136 may be formed of $Cu_2O$, SnO, NiO, $CuMO_2$ (delafossite, M=Al, Ga, In, Sr, Y, Sc, and Cr), $ZnM_2O_4$ (spinel, M=Co, Rh, Ir), LnCuOCh (oxychalcogenide, Ln=lanthanoids (La~Lu), Ch=Se, S, and Te), or Cu-nanowire.

If each of the first N-type semiconductor layer 133 and the second N-type semiconductor layer 135 is formed as the N-type oxide semiconductor layer and each of the first P-type semiconductor layer 134 and the second P-type semiconductor layer 136 is the P-type oxide semiconductor layer, a thickness of each of the first P-type semiconductor layer 134 and the second P-type semiconductor layer 136 may be set thinner than that of each of the first N-type semiconductor layer 133 and the second N-type semiconductor layer 135. Particularly, in order to normally realize the P-type semiconductor characteristic, a thickness of each of the first P-type semiconductor layer 134 and the second P-type semiconductor layer 136 may be adjusted to 10 nm or less.

A length L3 of the second N-type semiconductor layer 135 in a first direction (an X-axis direction) may be set longer than a length L4 of the second P-type semiconductor layer 136 in the first direction (the X-axis direction). Therefore, a portion of the second N-type semiconductor layer 135 may not be covered by the second P-type semiconductor layer 136. Therefore, the second source electrode 143 and the second drain electrode 144 may be connected to the portion of the second N-type semiconductor layer 135 uncovered by the second P-type semiconductor layer 136.

In FIG. 11, an example where a length of the first N-type semiconductor layer 133 in the first direction (the X-axis direction) is set substantially equal to that of the first P-type semiconductor layer 134 in the first direction (the X-axis direction) is illustrated, but the present embodiment is not limited thereto. In other embodiments, the length of the first N-type semiconductor layer 133 in the first direction (the X-axis direction) may be set longer than that of the first P-type semiconductor layer 134 in the first direction (the X-axis direction).

Moreover, in FIG. 11, an example where a length of the first N-type semiconductor layer 133 in a second direction (a Y-axis direction) is set substantially equal to that of the first P-type semiconductor layer 134 in the second direction (the Y-axis direction) is illustrated, but the present embodiment is not limited thereto. In other embodiments, the length of the first N-type semiconductor layer 133 in the second direction (the Y-axis direction) may be set longer than that of the first P-type semiconductor layer 134 in the second direction (the Y-axis direction). Also, an example where a length of the second N-type semiconductor layer 135 in the second direction (the Y-axis direction) is set substantially equal to that of the second P-type semiconductor layer 136 in the second direction (the Y-axis direction) is illustrated, but the present embodiment is not limited thereto. In other embodiments, the length of the second N-type semiconductor layer 135 in the second direction (the Y-axis direction) may be set longer than that of the second P-type semiconductor layer 136 in the second direction (the Y-axis direction).

A second gate insulation layer 151 and a third gate insulation layer 152 may be formed on the first P-type semiconductor layer 134 and the second P-type semiconductor layer 136. Each of the second gate insulation layer 151 and the third gate insulation layer 152 may be formed of an inorganic layer, and for example, may be formed of SiOx, SiNx, or a multilayer thereof. The third gate insulation layer 152 may be omitted.

The first top gate electrode 161 and the second top gate electrode 162 may be formed on the third gate insulation layer 152. The first top gate electrode 161 and the second top gate electrode 162 may each be formed of a single layer or a multilayer which includes one of Mo, Al, Cr, Au, Ti, Ni, Nd, and Cu, or an alloy thereof.

In FIG. 11, an example where a length of the first top gate electrode 161 in the second direction (the Y-axis direction) is set longer than that of the first P-type semiconductor layer 134 in the second direction (the Y-axis direction) is illustrated, but the present embodiment is not limited thereto. In other embodiments, the length of the first top gate electrode 161 in the second direction (the Y-axis direction) may be set substantially equal to or shorter than that of the first P-type semiconductor layer 134 in the second direction (the Y-axis direction). As the length of the first top gate electrode 161 in the second direction (the Y-axis direction) increases, a channel region of the first P-type semiconductor layer 134 may be widely provided, and thus, based on this, the length of the first top gate electrode 161 in the second direction (the Y-axis direction) may be designed.

Moreover, in FIG. 11, an example where a length of the second top gate electrode 162 in the second direction (the Y-axis direction) is set longer than that of the second P-type semiconductor layer 136 in the second direction (the Y-axis direction) is illustrated, but the present embodiment is not limited thereto. In other embodiments, the length of the second top gate electrode 162 in the second direction (the Y-axis direction) may be set substantially equal to or shorter than that of the second P-type semiconductor layer 136 in the second direction (the Y-axis direction). As the length of the second top gate electrode 162 in the second direction (the Y-axis direction) increases, a channel region of the second P-type semiconductor layer 136 may be widely provided, and thus, based on this, the length of the second top gate electrode 162 in the second direction (the Y-axis direction) may be designed.

An interlayer insulation layer 170 may be formed on the first gate insulation layer 120, the first N-type semiconductor layer 133, the first P-type semiconductor layer 134, the second N-type semiconductor layer 135, the second P-type semiconductor layer 136, and the first top gate electrode 161. The interlayer insulation layer 170 may be formed of an inorganic layer, and for example, may be formed of SiOx, SiNx, or a multilayer thereof.

A first contact hole C1 and a second contact hole C2, which pass through the interlayer insulation layer 170 to expose the first P-type semiconductor layer 134, may be formed in the interlayer insulation layer 170, and a third contact hole C3 and a fourth contact hole C4, which pass through the interlayer insulation layer 170 to expose the second N-type semiconductor layer 135, may be formed in the interlayer insulation layer 170. In detail, a portion of the second N-type semiconductor layer 135 uncovered by the second P-type semiconductor layer 136 may be exposed by the third contact hole C3 and the fourth contact hole C4.

The first source electrode 141, the first drain electrode 142, the second source electrode 143, and the second drain electrode 144 may be formed on the interlayer insulation layer 170. The first source electrode 141 may be connected to the first P-type semiconductor layer 134 through the first contact hole C1. The first drain electrode 142 may be connected to the first P-type semiconductor layer 134 through the second contact hole C2. The second source electrode 143 may be connected to, through the third contact hole C3, the portion of the second N-type semiconductor layer 135 uncovered by the second P-type semiconductor layer 136. The second drain electrode 144 may be connected to, through the fourth contact hole C4, the portion of the second N-type semiconductor layer 135 uncovered by the second P-type semiconductor layer 136. The second contact hole C2 and the fourth contact hole C4 are disposed between the first contact hole C1 and the third contact hole C3.

The first source electrode 141 and the first drain electrode 142 may be connected to the first P-type semiconductor layer 134, and the second source electrode 143 and the second drain electrode 144 may be connected to the second N-type semiconductor layer 135. Accordingly, an interval between the first source electrode 141 and the first drain electrode 142 may be shorter than an interval between the second source electrode 143 and the second drain electrode 144. That is to say, a distance between the first contact hole C1 and the second contact hole C2 is shorter than a distance between the third contact hole C3 and the fourth contact hole C4.

The first drain electrode 142 may be connected to the second drain electrode 144, and in this case, the TFT 10 may function as a CMOS.

Figure 13:
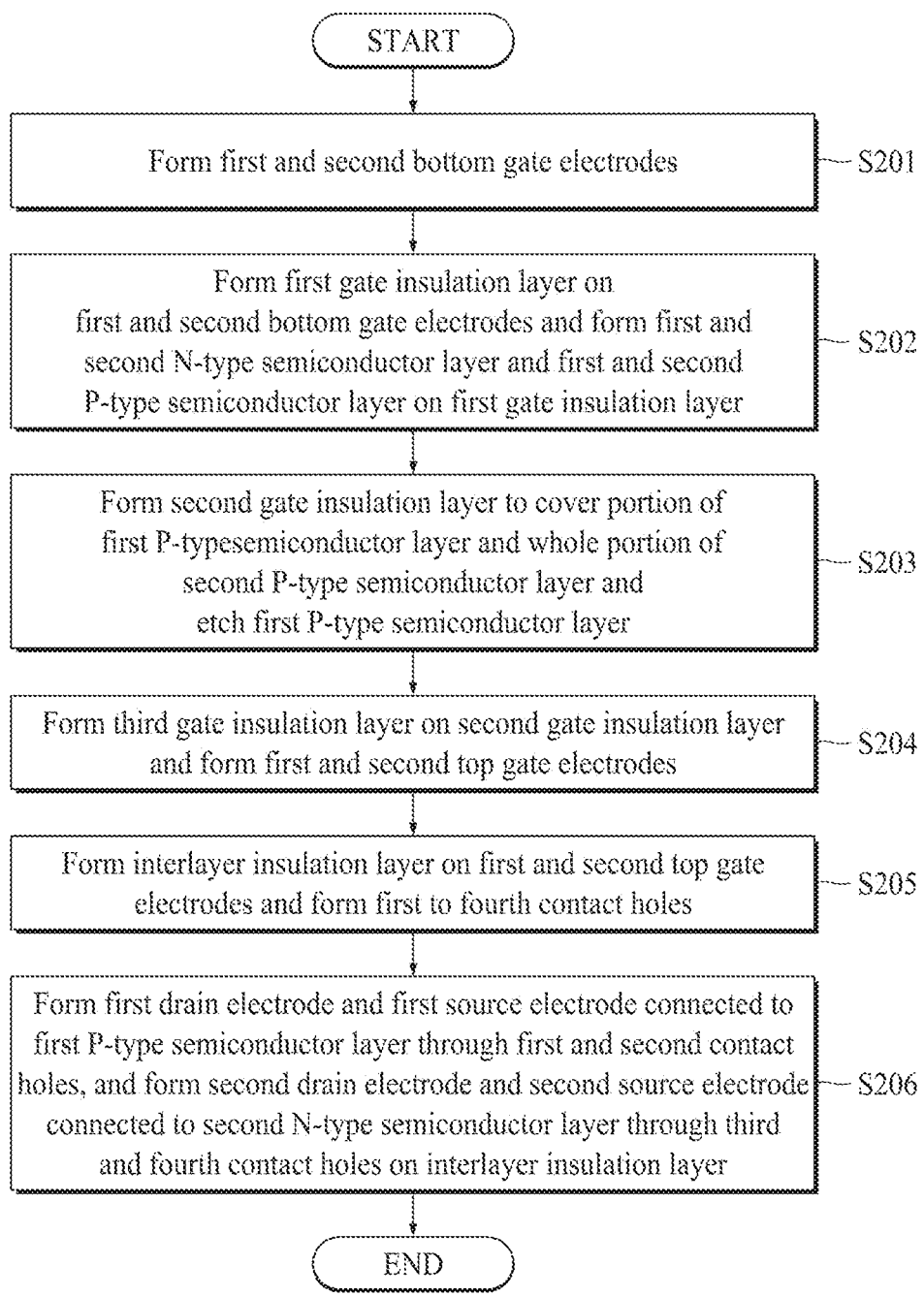
FIG. 13 is a flowchart illustrating a method of manufacturing a TFT according to another embodiment of the present disclosure.

FIG. 13 is a flowchart illustrating a method of manufacturing a TFT according to another embodiment of the present disclosure. FIGS. 14A to 14F are cross-sectional views for describing a method of manufacturing a TFT according to another embodiment of the present disclosure.

The cross-sectional views illustrated in FIGS. 14A to 14F relate to a method of manufacturing the TFT illustrated in FIG. 13, and thus, like reference numerals refer to like elements. Hereinafter, a method of manufacturing a TFT according to another embodiment of the present disclosure will be described in detail with reference to FIGS. 13 and 14A to 14F.

The method of manufacturing a thin film transistor according to another embodiment of the present disclosure comprises: forming a first bottom gate electrode and a second bottom gate electrode on a substrate; forming a first semiconductor layer overlapping with the first bottom gate electrode and a second semiconductor layer overlapping with the second bottom gate electrode, wherein the second semiconductor layer comprises a second N-type semiconductor layer and a second P-type semiconductor layer, and the second N-type semiconductor layer is overlapped partly with the second P-type semiconductor layer; forming a first source electrode and a first drain electrode respectively connected to the first semiconductor layer; forming a second source electrode and a second drain electrode respectively connected to a portion of the second N-type semiconductor layer which is not overlapped with the second P-type semiconductor layer; and forming a first top gate electrode on the first semiconductor layer.

Figure 14A:
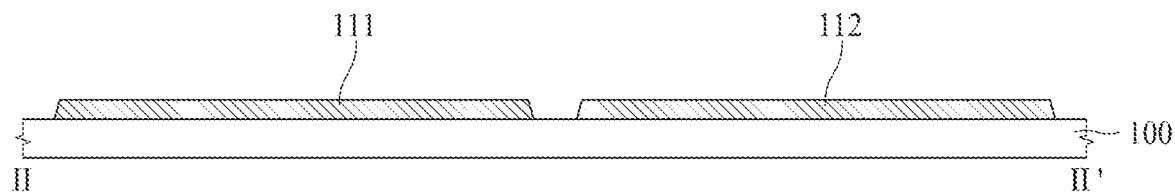
FIGS. 14A to 14F are cross-sectional views for describing a method of manufacturing a TFT according to another embodiment of the present disclosure.

First, as in FIG. 14A, a first bottom gate electrode 111 and a second bottom gate electrode 112 may be formed on a substrate 100. Step S201 of FIG. 13 is substantially the same as step S101 of FIG. 9, and thus, its detailed description is omitted. (S201 of FIG. 13)

Figure 14B:
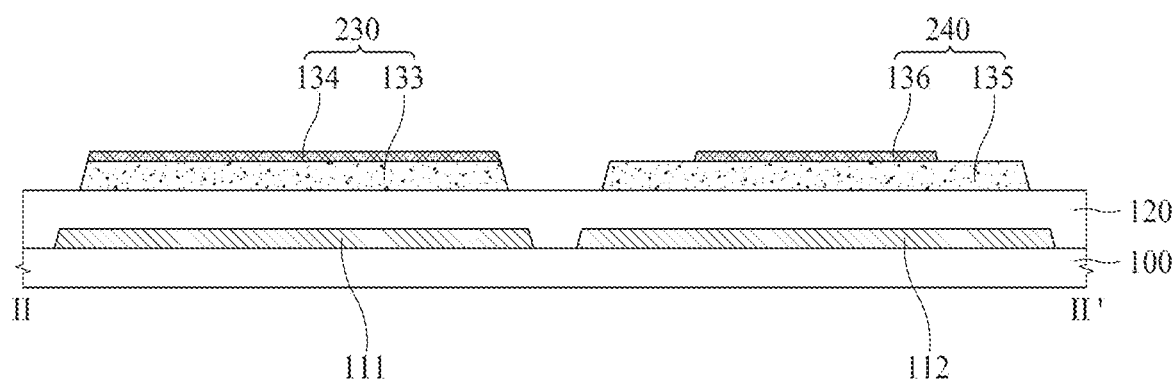

Second, as in FIG. 14B, a first gate insulation layer 120 may be formed on the first bottom gate electrode 111 and the second bottom gate electrode 112, a first N-type semiconductor layer 133 and a second N-type semiconductor layer 135 may be formed on the first gate insulation layer 120, a first P-type semiconductor layer 134 may be formed on the first N-type semiconductor layer 133, and a second P-type semiconductor layer 136 may be formed on the second N-type semiconductor layer 135. Step S202 of FIG. 13 is substantially the same as step S102 of FIG. 9, and thus, its detailed description is omitted. (S202 of FIG. 13)

Figure 14C:
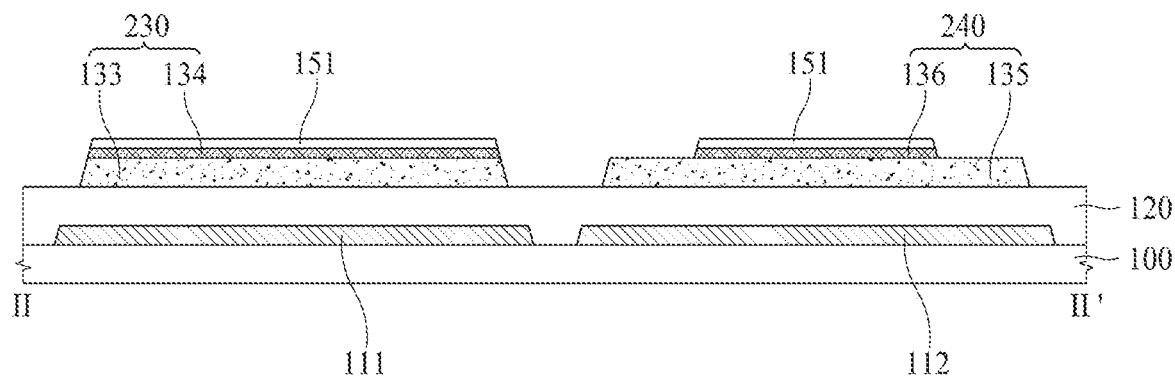

Third, as in FIG. 14C, a second gate insulation layer 151 may be formed to cover a whole portion of the first P-type semiconductor layer 134 and a portion of the second P-type semiconductor layer 136, and a portion of the second P-type semiconductor layer 136 uncovered by the second gate insulation layer 151 may be etched by using the second gate insulation layer 151 as a passivation layer. Therefore, a length L3 of the second N-type semiconductor layer 135 in a first direction (an X-axis direction) may be set longer than a length L4 of the second P-type semiconductor layer 136 in the first direction (the X-axis direction). (S203 of FIG. 13)

Figure 14D:
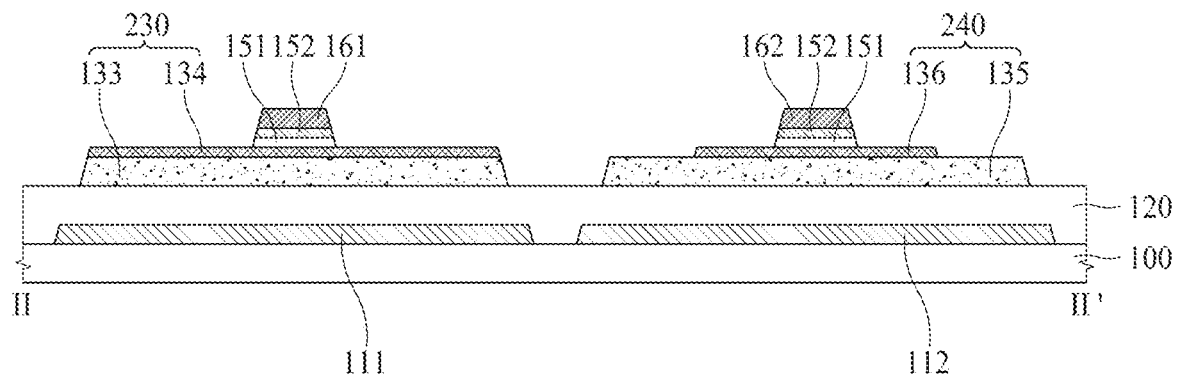

Fourth, as in FIG. 14D, a third gate insulation layer 152 may be formed on the second gate insulation layer 151, and a top gate electrode 160 may be formed on the third gate insulation layer 152.

In detail, the third gate insulation layer 152 may be formed on a whole upper surface of the second gate insulation layer 151 through a PECVD process. Subsequently, a second metal layer may be formed on a whole upper surface of the third gate insulation layer 152 through a sputtering process or an MOCVD process. Subsequently, the second gate insulation layer 151, the third gate insulation layer 152, the first top gate electrode 161, and the second top gate electrode 162 may be finished by simultaneously patterning the second gate insulation layer 151, the third gate insulation layer 152, and the second metal layer through a mask process using a photoresist pattern. The first top gate electrode 161 may overlap the first P-type semiconductor layer 134, and the second top gate electrode 162 may overlap the second P-type semiconductor layer 136. The second top gate electrode 162 and the third gate insulation layer 152 may be omitted. (S204 of FIG. 13)

Figure 14E:
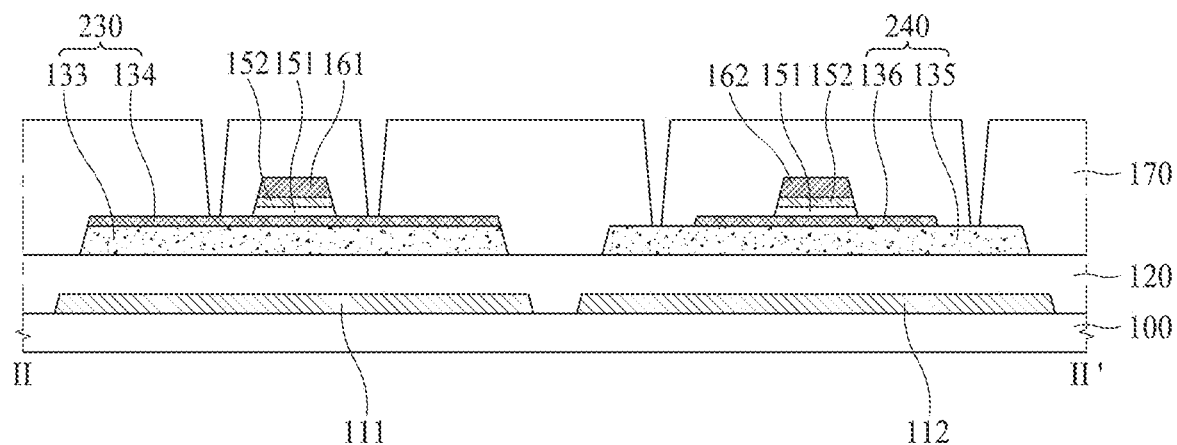

Fifth, as in FIG. 14E, an interlayer insulation layer 170 may be formed on the first N-type semiconductor layer 131, the first P-type semiconductor layer 134, the second N-type semiconductor layer 135, the second P-type semiconductor layer 136, the first top gate electrode 161, and the second top gate electrode 162. The interlayer insulation layer 170 may be formed through a PECVD process.

Subsequently, a first contact hole C1 and a second contact hole C2, which pass through the interlayer insulation layer 170 to expose the first P-type semiconductor layer 134, may be formed, and a third contact hole C3 and a fourth contact hole C4, which expose a portion of the first N-type semiconductor layer 135 uncovered by the second P-type semiconductor layer 136, may be formed. (S205 of FIG. 13)

Figure 14F:
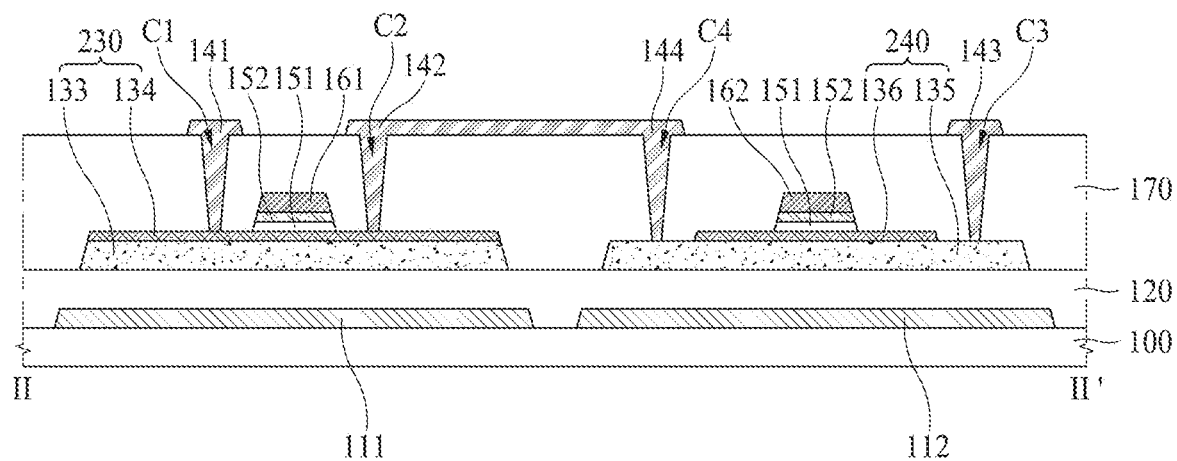

Sixth, as in FIG. 14F, first and second source electrodes 141 and 143 and first and second drain electrodes 142 and 144 may be formed on the interlayer insulation layer 170.

In detail, a third metal layer may be formed on a whole upper surface of the interlayer insulation layer 170 through atg sputtering process or an MOCVD process. Subsequently, the first and second source electrodes 141 and 143 and the first and second drain electrodes 142 and 144 may be formed by patterning the third metal layer through a mask process using a photoresist pattern.

The first source electrode 141 may be connected to the first P-type semiconductor layer 134 through the first contact hole C1. The first drain electrode 142 may be connected to the first P-type semiconductor layer 134 through the second contact hole C2. The second source electrode 143 may be connected to, through the third contact hole C3, a portion of the second N-type semiconductor layer 135 uncovered by the second P-type semiconductor layer 136. The second drain electrode 144 may be connected to, through the fourth contact hole C4, the portion of the second N-type semiconductor layer 135 uncovered by the second P-type semiconductor layer 136.

The first drain electrode 142 may be connected to the second drain electrode 144, and in this case, the TFT 10 may function as a CMOS.

The first and second source electrodes 141 and 143 and the first and second drain electrodes 142 and 144 may each be formed of a single layer or a multilayer which includes one of Mo, Al, Cr, Au, Ti, Ni, Nd, and Cu, or an alloy thereof. Also, the first source electrode 141 and the first drain electrode 142 may be connected to the first P-type semiconductor layer 134, and thus, based on this, the first source electrode 141 and the first drain electrode 142 may each be formed of a single layer or a multilayer which includes one of Pd having a work function of 5.22 eV to 5.6 eV, Pt having a work function of 5.12 eV to 5.93 eV, Au having a work function of 5.1 eV to 5.47 eV, and Ni having a work function of 5.04 eV to 5.35 eV, which have a work function higher than 5.0 eV, or an alloy thereof. (S206 of FIG. 13)

As described above, according to the embodiments of the present disclosure, the CMOS circuit may be implemented with one transistor including the P-type semiconductor layer and the N-type semiconductor layer, or the P-type transistor or the N-type transistor may be selectively implemented. Accordingly, a manufacturing process is not complicated.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
a bottom gate electrode on a substrate;
a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer;
a first source electrode and a first drain electrode respectively connected to the P-type semiconductor layer;
a second source electrode and a second drain electrode respectively connected to a portion of the N-type semiconductor layer which is not overlapped with the P-type semiconductor layer; and
a top gate electrode above the semiconductor layer.

2. The thin film transistor of claim 1, further comprising an interlayer insulation layer covering the semiconductor layer and the top gate electrode.

3. The thin film transistor of claim 2, further comprising:
a first contact hole which passes through the interlayer insulation layer to expose a first part of the P-type semiconductor layer;
a second contact hole which passes through the interlayer insulation layer to expose a second part of the P-type semiconductor layer
a third contact hole which passes through the interlayer insulation layer to expose a first part of the portion of the N-type semiconductor layer which is not overlapped with the P-type semiconductor layer; and
a fourth contact hole which passes through the interlayer insulation layer to expose a second part of the portion of the N-type semiconductor layer which is not overlapped with the P-type semiconductor layer.

4. The thin film transistor of claim 3, wherein
the first source electrode is connected to the P-type semiconductor layer through the first contact hole and the first drain electrode is connected to the P-type semiconductor layer through the second contact hole, and
the second source electrode is connected to the portion of the N-type semiconductor layer which is not overlapped with the P-type semiconductor layer through the third contact hole and the second drain electrode is connected to the portion of the N-type semiconductor layer which is not overlapped with the P-type semiconductor layer through the fourth contact hole.

5. The thin film transistor of claim 3, wherein the first contact hole and the second contact hole are disposed between the third contact hole and the fourth contact hole.

6. The thin film transistor of claim 1, wherein the first drain electrode is connected to the second drain electrode.

7. The thin film transistor of claim 1, wherein a thickness of the P-type semiconductor layer is thinner than that of the N-type semiconductor layer.

8. The thin film transistor of claim 7, wherein the thickness of the P-type semiconductor layer is 10 nm or less.

9. The thin film transistor of claim 1, wherein the P-type semiconductor layer is formed of $Cu_2O$.

10. The thin film transistor of claim 1, wherein when a positive voltage is applied to the bottom gate electrode, the N-type semiconductor layer is configured to have the N-type semiconductor characteristic, and when a negative voltage is applied to the top gate electrode, the P-type semiconductor layer is configured to have the P-type semiconductor characteristic.

11. A display device including a thin film transistor, wherein the display device comprises:
a display panel;
a data driving circuit; and
a gate driving circuit,
wherein the display panel or the gate driving circuit comprises a thin film transistor and the thin film transistor comprising:
a bottom gate electrode on a substrate;
a semiconductor layer overlapping with the bottom gate electrode, wherein the semiconductor layer comprises a N-type semiconductor layer and a P-type semiconductor layer, and the N-type semiconductor layer is overlapped partly with the P-type semiconductor layer;
a first source electrode and a first drain electrode respectively connected to the P-type semiconductor layer;
a second source electrode and a second drain electrode respectively connected to a portion of the N-type semiconductor layer which is not overlapped with the P-type semiconductor layer; and
a top gate electrode above the semiconductor layer.

12. A thin film transistor comprising:
a first bottom gate electrode and a second bottom gate electrode on a substrate;
a first semiconductor layer overlapping with the first bottom gate electrode and a second semiconductor layer overlapping with the second bottom gate electrode, wherein the second semiconductor layer comprises a second N-type semiconductor layer and a second P-type semiconductor layer, and the second N-type semiconductor layer is overlapped partly with the second P-type semiconductor layer;

a first source electrode and a first drain electrode respectively connected to the first semiconductor layer;

a second source electrode and a second drain electrode respectively connected to a portion of the second N-type semiconductor layer which is not overlapped with the second P-type semiconductor layer; and a first top gate electrode on the first semiconductor layer.

13. The thin film transistor of claim 12, further comprising an interlayer insulation layer covering the first semiconductor layer, the second semiconductor layer and the first top gate electrode.

14. The thin film transistor of claim 13, further comprising:
a first contact hole and a second contact hole which respectively passes through the interlayer insulation layer to expose a part of the first semiconductor layer; and
a third contact hole and a forth contact hole which respectively passes through the interlayer insulation layer to expose a part of the portion of the second N-type semiconductor layer which is not overlapped with the second P-type semiconductor layer.

15. The thin film transistor of claim 14, wherein
the first source electrode is connected to the first semiconductor layer through the first contact hole and the first drain electrode is connected to the first semiconductor layer through the second contact hole, and
the second source electrode is connected to the portion of the second N-type semiconductor layer which is not overlapped with the second P-type semiconductor layer through the third contact hole and the second drain electrode is connected to the portion of the second N-type semiconductor layer which is not overlapped with the second P-type semiconductor layer through the fourth contact hole.

16. The thin film transistor of claim 14, wherein the second contact hole and the fourth contact hole are disposed between the first contact hole and the third contact hole.

17. The thin film transistor of claim 16, wherein an interval between the first contact hole and the second contact hole is shorter than an interval between the third contact hole and the fourth contact hole.

18. The thin film transistor of claim 12, wherein the first drain electrode is connected to the second drain electrode.

19. The thin film transistor of claim 12, wherein the first semiconductor layer comprises a first N-type semiconductor layer and a first P-type semiconductor layer, and a thickness of the first P-type semiconductor layer is thinner than that of the first N-type semiconductor layer and a thickness of the second P-type semiconductor layer is thinner than that of the second N-type semiconductor layer.

20. The thin film transistor of claim 12, wherein the first semiconductor layer comprises a first N-type semiconductor layer and a first P-type semiconductor layer, and the first N-type semiconductor layer is overlapped fully with the first P-type semiconductor layer.

21. The thin film transistor of claim 12, wherein the first semiconductor layer comprises a first N-type semiconductor layer and a first P-type semiconductor layer, and the first N-type semiconductor layer is overlapped partly with the first P-type semiconductor layer.

22. The thin film transistor of claim 12, wherein the first semiconductor layer comprises a first N-type semiconductor layer and a first P-type semiconductor layer, and each of the first P-type semiconductor layer and the second P-type semiconductor layer is formed of $Cu_2O$.

23. A display device including a thin film transistor, wherein the display device comprises:
a display panel;
a data driving circuit; and
a gate driving circuit,
wherein the display panel or the gate driving circuit comprises the thin film transistor and the thin film transistor comprising:
a first bottom gate electrode and a second bottom gate electrode on a substrate;
a first semiconductor layer overlapping with the first bottom gate electrode and a second semiconductor layer overlapping with the second bottom gate electrode, wherein the second semiconductor layer comprises a second N-type semiconductor layer and a second P-type semiconductor layer, and the second N-type semiconductor layer is overlapped partly with the second P-type semiconductor layer;
a first source electrode and a first drain electrode respectively connected to the first semiconductor layer;
a second source electrode and a second drain electrode respectively connected to a portion of the second N-type semiconductor layer which is not overlapped with the second P-type semiconductor layer; and
a first top gate electrode on the first semiconductor layer.

* * * * *